US012666812B2

(12) United States Patent
Shin et al.

(10) Patent No.: US 12,666,812 B2
(45) Date of Patent: Jun. 23, 2026

(54) DISPLAY DEVICE

(71) Applicant: Samsung Display Co., LTD., Yongin-si (KR)

(72) Inventors: Hee Kyun Shin, Yongin-si (KR); Yong Hoon Yang, Yongin-si (KR); Myoung Geun Cha, Yongin-si (KR); Ki Seok Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 366 days.

(21) Appl. No.: 18/236,319

(22) Filed: Aug. 21, 2023

(65) Prior Publication Data

US 2024/0206246 A1 Jun. 20, 2024

(30) Foreign Application Priority Data

Dec. 2, 2022 (KR) ........................ 10-2022-0166256

(51) Int. Cl.
*H01L 29/08* (2006.01)
*C08G 73/10* (2006.01)
(Continued)

(52) U.S. Cl.
CPC ....... *H10K 59/126* (2023.02); *C08G 73/1007* (2013.01); *C08G 73/1064* (2013.01);
(Continued)

(58) Field of Classification Search
CPC ........... H10K 59/126; H10K 2102/311; H10K 77/111; H10K 10/464; H10K 10/466; H10K 10/484; H10K 59/12; H10K 59/1213; H10K 71/12; H10K 71/15; H10K 71/164; H10K 71/191; H10K 85/622; H10K 85/623; H10K 59/40; C08G 73/1007; C08G 73/1064; C08G 73/1071; C08J 5/18; C08J 2379/08; H01L 21/0212; H01L 21/02282; H01L 21/311; H01L 21/60; H01L 2224/0231; H01L 2224/02311; H01L 2224/02375; H01L 2224/02377; H01L 2224/024; H01L 2224/0401; H01L 2224/05124; H01L 2224/05147; H01L 2224/05155;
(Continued)

(56) References Cited

U.S. PATENT DOCUMENTS

| | | | | |
|---|---|---|---|---|
| 2022/0140262 A1* | 5/2022 | Bae | ...................... | G09G 3/3233 257/40 |
| 2022/0293886 A1* | 9/2022 | Seon | ...................... | H10K 77/10 |

FOREIGN PATENT DOCUMENTS

| | | |
|---|---|---|
| KR | 10-1777443 B1 | 9/2017 |
| KR | 2017-0135555 A | 12/2017 |

(Continued)

*Primary Examiner* — Niki H Nguyen
(74) *Attorney, Agent, or Firm* — Womble Bond Dickinson (US) LLP

(57) ABSTRACT

A display device including a first substrate and a second substrate. A first barrier layer is on the first substrate and the second substrate is on the first barrier layer. A second barrier layer is on the second substrate and a buffer layer is on the second barrier layer. At least one transistor is on the buffer layer and an organic light-emitting diode is on the at least one transistor. The second substrate comprises a polyimide resin and a dielectric constant of the second substrate is smaller than a dielectric constant of the first substrate.

25 Claims, 9 Drawing Sheets

(51) Int. Cl.
*C08J 5/18* (2006.01)
*H10K 59/126* (2023.01)

(52) U.S. Cl.
CPC ............ *C08G 73/1071* (2013.01); *C08J 5/18* (2013.01); *C08J 2379/08* (2013.01)

(58) Field of Classification Search
CPC . H01L 2224/05166; H01L 2224/05171; H01L 2224/05548; H01L 2224/05569; H01L 2224/05624; H01L 2224/05644; H01L 2224/05647; H01L 2224/05671; H01L 2224/13024; H01L 2224/13099; H01L 2224/131; H01L 23/5286; H01L 24/02; H01L 24/05; H01L 24/11; H01L 24/13; H01L 2924/0001; H01L 2924/01005; H01L 2924/01006; H01L 2924/01013; H01L 2924/01015; H01L 2924/01022; H01L 2924/01024; H01L 2924/01029; H01L 2924/01033; H01L 2924/01074; H01L 2924/01076; H01L 2924/01078; H01L 2924/01079; H01L 2924/01082; H01L 2924/014; H01L 2924/12042; H01L 2924/12044; H01L 2924/13091; H01L 2924/14; H01L 2924/30105; H01L 2924/3011; H01L 2924/3025; G02F 1/133345; G02F 1/134309; G02F 1/134372; G02F 1/13439; G02F 1/13606; G02F 1/136209; G02F 1/136286; G02F 2201/121; G02F 2201/123; G02F 2202/42; G02F 1/13471; G02F 2203/30; G02F 1/133528; G02F 1/133602; G02F 1/133707; G02F 1/136222
See application file for complete search history.

(56) References Cited

FOREIGN PATENT DOCUMENTS

| | | |
|---|---|---|
| KR | 2019-0071195 A | 6/2019 |
| KR | 2020-0096070 A | 8/2020 |

* cited by examiner

120: 121
130: 131, 133
150: 151
160: 161, 162, 163, 164, 165
170: 171
T1 : 105, 121, 164, 165
T2 : 145, 151, 161, 162

DISPLAY DEVICE

CROSS REFERENCED TO RELATED APPLICATION

This application claims priority to and the benefit of Korean Patent Application No. 10-2022-0166256 filed on Dec. 2, 2022, in the Korean Intellectual Property Office, the content of which is incorporated herein by reference in its entirety.

BACKGROUND

1. Field

One or more aspects of embodiments of the present disclosure relate to a display device.

2. Description of the Related Art

As the information-oriented society evolves, the demands for improved performance of display devices are ever increasing. For example, display devices are being employed by a variety of electronic devices such as smart phones, digital cameras, laptop computers, navigation devices, and/or smart televisions.

Display devices may be flat-panel display devices such as a liquid-crystal display device, a field emission display device, and/or an organic light-emitting display device. Among such flat panel display devices, a light-emitting display device (e.g., an organic light-emitting display device) includes a light-emitting element that can emit light on its own, so that each of the pixels of the display panel of the device may emit light by themselves. Accordingly, the light-emitting display device may be able to display images without a backlight unit that supplies light to the display panel.

SUMMARY

One or more aspects of embodiments of the present disclosure are directed toward a display device including a substrate having improved dielectric constant and transmittance.

Aspects of the present disclosure also provide a display device having improved display quality.

It should be noted that objects of the present disclosure are not limited to the above-mentioned object; and other objects of the present disclosure will be apparent to those skilled in the art from the following descriptions.

One or more embodiments of the present disclosure relate to a display device that includes a first substrate, a first barrier layer disposed or located on the first substrate, a second substrate disposed or located on the first barrier layer, a second barrier layer disposed or located on the second substrate, a buffer layer disposed or located on the second barrier layer, at least one transistor disposed or located on the buffer layer, and an organic light-emitting diode disposed or located on the at least one transistor. In an embodiment, the second substrate includes a polyimide resin, and a dielectric constant of the second substrate is less than a dielectric constant of the first substrate.

In an embodiment, the dielectric constant of the second substrate is equal to or less than 3.5.

In an embodiment, a glass transition temperature of the second substrate is equal to or greater than 350° C.

In an embodiment, the second substrate has a thermal decomposition temperature of 450° C. or greater when a weight loss rate is 1%.

In an embodiment, a thermal expansion coefficient of the second substrate is equal to or less than 20 parts per million per (ppm)/° C.

In an embodiment, the second substrate has a transmittance of 85% or greater for light having a wavelength of 450 nanometer (nm).

In an embodiment, a Young's modulus of the second substrate is equal to or greater than 5 gigapascal (GPa).

In an embodiment, an elongation of the second substrate is equal to or greater than 15%.

In an embodiment, the polyimide resin contains fluorine atoms.

In an embodiment, the polyimide resin has a bent molecular structure.

In an embodiment, the polyimide resin includes at least one aliphatic ring.

One or more embodiments of the present disclosure relate to a display device that includes a first substrate, a first barrier layer disposed or located on the first substrate, a second substrate disposed or located on the first barrier layer, a second barrier layer disposed or located on the second substrate, a buffer layer disposed or located on the second barrier layer, at least one transistor disposed or located on the buffer layer, and an organic light-emitting diode disposed or located on the at least one transistor. In an embodiment, the first substrate and the second substrate include (e.g., each includes) a polyimide resin, and have a transmittance of 85% or greater for light having a wavelength of 450 nm.

In an embodiment, a dielectric constant of each of the first substrate and the second substrate is equal to or less than 3.5.

In an embodiment, a glass transition temperature of the second substrate is equal to or greater than 350° C.

In an embodiment, the second substrate has a thermal decomposition temperature of 450° C. or greater when a weight loss rate is 1%.

In an embodiment, a thermal expansion coefficient of the second substrate is equal to or less than 20 ppm/° C.

In an embodiment, the second substrate has a transmittance of 85% or greater for a light having a wavelength of 450 nm.

In an embodiment, a Young's modulus of the second substrate is equal to or greater than 5 GPa.

In an embodiment, an elongation of the second substrate is equal to or greater than 15%.

In an embodiment, the polyimide resin includes one selected from among

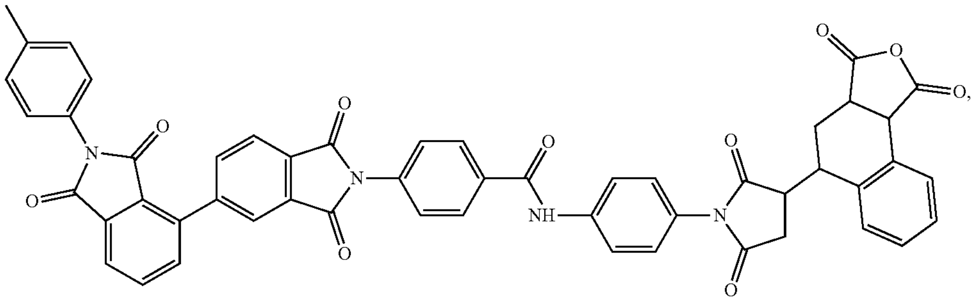
,

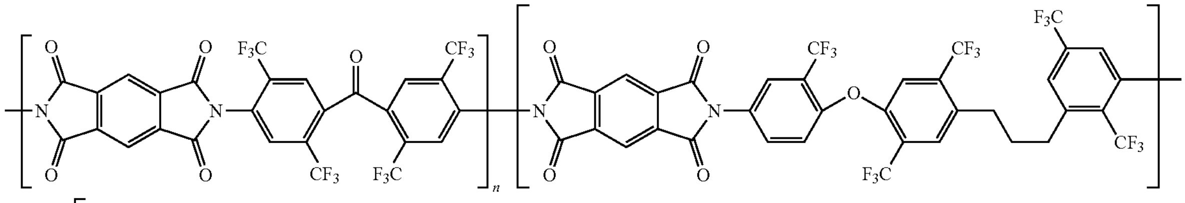
,

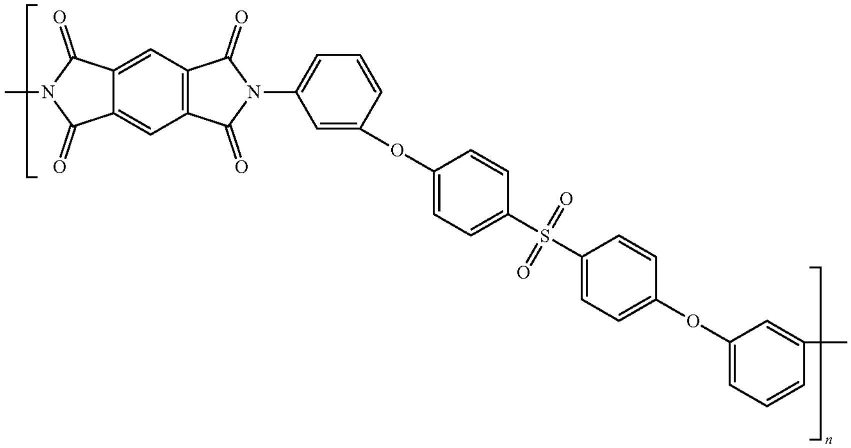
and

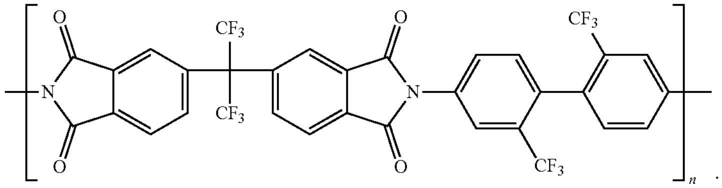
.

One or more embodiments of the present disclosure relate to a display device that includes a first substrate, a first barrier layer disposed or located at (e.g., on) the first substrate, a second substrate disposed or located at (e.g., on) the first barrier layer, and each of a first transistor and a second transistor disposed or located at (e.g., on) the second substrate. In an embodiment, the first transistor includes a polysilicon semiconductor layer and the second transistor includes an oxide semiconductor layer. In an embodiment, the display device includes an organic light-emitting diode disposed or located at (e.g., on) on the first transistor. In an embodiment, no conductive member is between (e.g., located between) the polysilicon semiconductor layer and the second substrate.

In an embodiment, the conductive member is configured to block or reduce light incident from the second substrate to the polysilicon semiconductor layer or block or reduce an electric field.

In an embodiment, the second substrate has a transmittance of 85% or greater for a light having a wavelength of 450 nm.

In an embodiment, the second substrate includes a polyimide resin, and the polyimide resin contains fluorine atoms.

In an embodiment, the second substrate includes a polyimide resin, and the polyimide resin has a bent molecular structure.

In an embodiment, the second substrate includes a polyimide resin, and the polyimide resin includes at least one aliphatic ring.

According to an embodiment of the present disclosure, a display device includes substrates including a polyimide resin having a bent molecular structure, a structure containing fluorine, or a structure containing an aliphatic ring, thereby decreasing the dielectric constant and improving the light transmittance of the substrates. Accordingly, it is possible to enhance or improve the moment afterimage and/or the mid to long term afterimage of the display device and/or to enhance of improve the transmittance of the display device.

It should be noted that aspects of the present disclosure are not limited to those described above and other aspects of the present disclosure will be apparent to those skilled in the art from the following descriptions.

BRIEF DESCRIPTION OF THE DRAWINGS

The above and other aspects will be more apparent and more readily appreciated from the following description of the embodiments, taken in conjunction with the accompanying drawings, in which.

DETAILED DESCRIPTION

Figure 1:
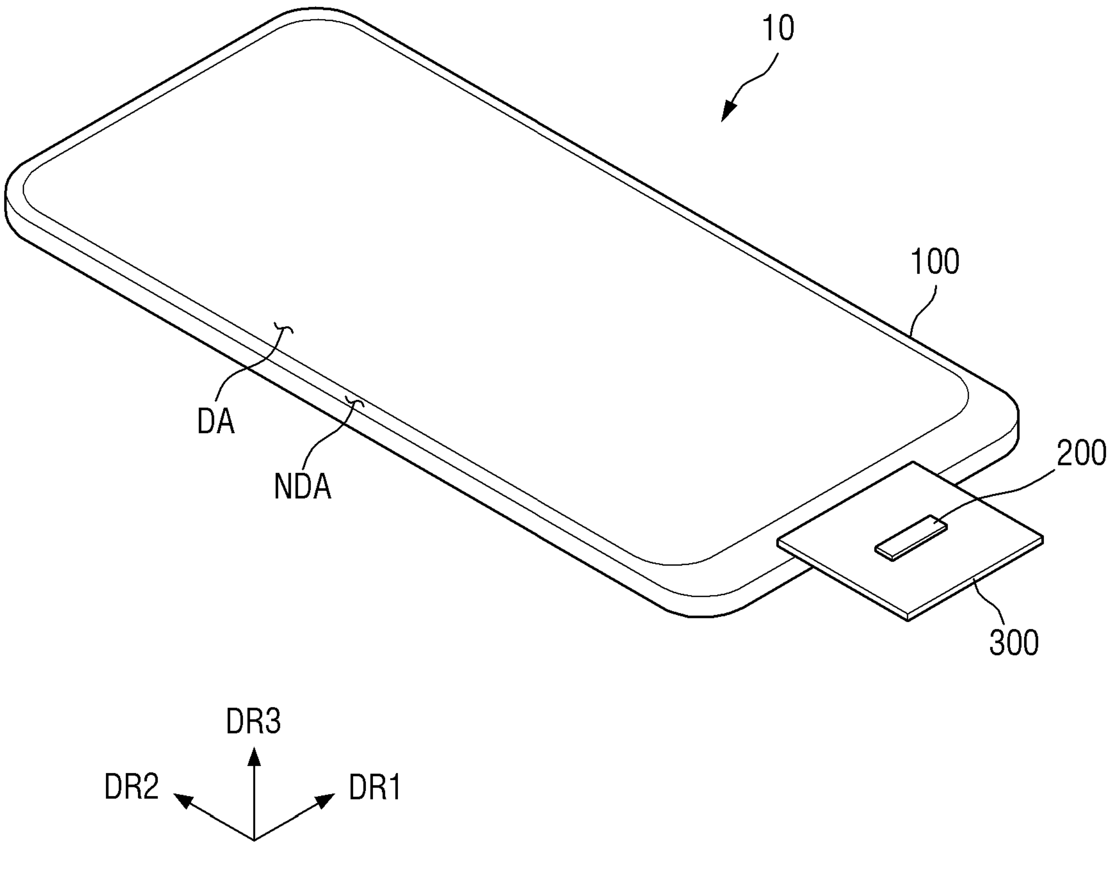
FIG. 1 is a perspective view of a display device according to an embodiment of the present disclosure.

The present disclosure will now be described more fully hereinafter with reference to the accompanying drawings, in which preferred embodiments of the present disclosure are shown. This present disclosure may, however, be embodied in different forms and should not be construed as limited to the embodiments set forth herein. Rather, these embodiments are provided so that this disclosure will be thorough and complete, and will filly convey the scope of the present disclosure to those skilled in the art.

The terminology used herein is for the purpose of describing embodiments and is not intended to limit the embodiments described herein. Unless otherwise defined, all chemical names, technical and scientific terms, and terms defined in common dictionaries should be interpreted as having meanings consistent with the context of the related art, and should not be interpreted in an ideal or overly formal sense.

As used herein, singular forms such as "a," "an," and "the" are intended to include the plural forms as well, unless the context clearly indicates otherwise.

It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof.

As used herein, the terms "use," "using," and "used" may be considered synonymous with the terms "utilize," "utilizing," and "utilized," respectively.

As used herein, expressions such as "at least one of," "one of," and "selected from," when preceding a list of elements, modify the entire list of elements and do not modify the individual elements of the list. For example, the expressions "at least one of a to c," "at least one of a, b or c," and "at least one of a, b and/or c" may indicate only a, only b, only c, both (e.g., simultaneously) a and b, both (e.g., simultaneously) a and c, both (e.g., simultaneously) b and c, all of a, b, and c, or variations thereof.

As used herein, the term "and/or" includes any and all combinations of one or more of the associated listed items.

The term "may" will be understood to refer to "one or more embodiments of the present disclosure," some of which include the described element and some of which exclude that element and/or include an alternate element. Similarly, alternative language such as "or" refers to "one or more embodiments of the present disclosure," each including a corresponding listed item.

It will be understood that when an element is referred to as being "on," "connected to," or "coupled to" another element, it may be directly on, connected, or coupled to the other element or one or more intervening elements may also be present. When an element is referred to as being "directly on," "directly connected to," or "directly coupled to" another element, there are no intervening elements present.

Spatially relative terms, such as "beneath," "below," "lower," "above," "upper," "bottom," "top," and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

Unless otherwise defined, all terms (including technical and scientific terms) used herein have the same meaning as commonly understood by those of ordinary skill in the art to which the present disclosure pertains. It is also to be understood that terms defined in commonly used dictionaries should be interpreted as having meanings consistent with meanings in the context of the related art, unless expressly defined herein, and should not be interpreted in an ideal or overly formal sense.

In this context, "consisting essentially of" means that any additional components will not materially affect the chemical, physical, optical or electrical properties of the semiconductor film.

Further, in this specification, the phrase "on a plane," or "plan view," means viewing a target portion from the top, and the phrase "on a cross-section" means viewing a cross-section formed by vertically cutting a target portion from the side.

It will be understood that, although the terms "first," "second," etc. may be utilized herein to describe one or more suitable elements, these elements should not be limited by these terms. These terms are only utilized to distinguish one element from another element. For instance, a first element discussed could be termed a second element without departing from the teachings of the present disclosure. Similarly, the second element could also be termed the first element.

Each of the features of the one or more suitable embodiments of the present disclosure may be combined or combined with each other, in part or in whole, and technically one or more suitable interlocking and driving are possible.

Each embodiment may be implemented independently of each other or may be implemented together in an association.

Hereinafter, embodiments of the present disclosure will be described with reference to the accompanying drawings. The same reference numbers indicate the same components throughout the specification.

Figure 2:
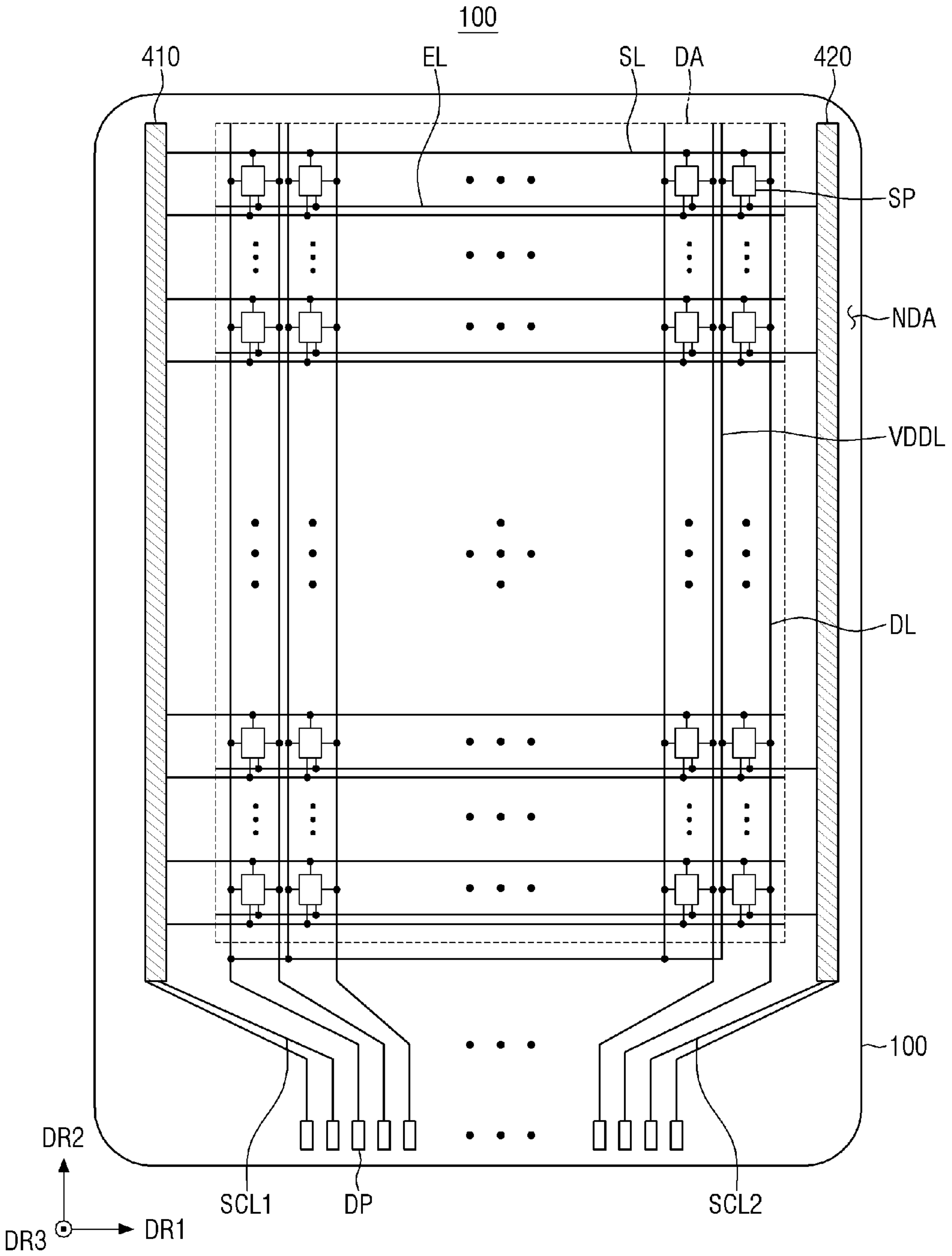
FIG. 2 is a plan view of a display panel according to an embodiment of the present disclosure.

In FIG. 1 is a perspective view of a display device 10, according to an embodiment of the present disclosure, that includes a display panel 100, a display driver 200, and a circuit board 300. FIG. 2 is a plan view showing an example of display panel 100, according to an embodiment of the present disclosure. As utilized herein, the terms "above," "top" and "upper surface" refer to the upper side of the display panel 100, i.e., the side indicated by the arrow in a third direction DR3, whereas the terms "below," "bottom" and "lower surface" refer to the lower side of the display panel 100, i.e., the opposite side in the third direction DR3.

The display device 10 is configured to display moving images or still images. The display device 10 may be utilized as the display screen of portable electronic devices such as a mobile phone, a smart phone, a tablet PC, a smart watch, a watch phone, a mobile communications terminal, an electronic notebook, an electronic book, a portable multimedia player (PMP), a navigation device and a ultra mobile PC (UMPC), as well as the display screen of one or more suitable products such as a television, a notebook, a monitor, a billboard and/or the Internet of Things. The display device 10 may be one of an organic light-emitting display device, a liquid-crystal display device, a plasma display device, a field emission display device, an electrophoretic display device, an electrowetting display device, a quantum dot light-emitting display device, a micro LED display device and/or the like. In the following description, an organic light-emitting display device is described as an example of the display device 10. It is, however, to be understood that the present disclosure is not limited thereto.

The display panel 100 may be formed in a rectangular plane having shorter sides in the first direction DR1 and longer sides in the second direction DR2 intersecting the first direction DR1. Each of the corners where the short side in the first direction DR1 meets the longer side in the second direction DR2 may be rounded, with a set or predetermined curvature, or may be a right angle. The shape of the display panel 100 when viewed from the top is not limited to a quadrangular shape, but may be formed in a different polygonal shape, a circular shape, or an elliptical shape. The display panel 100 may be, but is not limited to being, formed to be flat. The display panel 100 may include curved portions formed at left and right ends thereof and having a constant or varying curvature. In some embodiments, the display panel 100 may be flexible so that it may be curved, bent, folded or rolled.

The display panel 100 may include a display area DA where sub-pixels SP are formed to display images, and a non-display area NDA which is the peripheral area of the display area DA. When the display panel 100 includes a curved portion, the display area DA may be located or disposed on the curved portion. In such case, images of the display panel 100 can also be viewed or seen on the curved portion.

In the display area DA, scan lines SL, emission lines EL, data lines DL and first supply voltage lines VDDL connected to the sub-pixels SP may be located or disposed, in addition to the sub-pixels SP. The scan lines SL and the emission lines EL may be located or arranged in the first direction DR1, while the data lines DL may be located or arranged in the second direction DR2 intersecting or crossing the first direction DR1. The first supply voltage lines VDDL may be located or arranged in parallel in the second direction DR2 in the display area DA. The first supply voltage lines VDDL formed in parallel in the second direction DR2 in the display area DA may be connected to one another in the non-display area NDA.

Each of the sub-pixels SP may be connected to at least one of the scan lines SL, at least one of the data lines DL, at least one of the emission lines EL, and at least one of the first supply voltage lines VDDL.

In the example shown in FIG. 2, an embodiment of the display panel 100 includes each of the sub-pixels SP connected to two scan lines SL, one data line DL, one emission line EL, and the first supply voltage line VDDL for convenience of illustration. It is, however, to be understood that the present disclosure is not limited thereto. For example, each of the sub-pixels SP may be connected to three scan lines SL rather than two scan lines SL.

Each of the sub-pixels SP may include a driving transistor, at least one switching transistor, a light-emitting element, and a capacitor. When the data voltage is applied to the gate electrode, the driving transistor may supply a driving current to the light-emitting element, so that light may be emitted. The driving transistor and the at least one switching transistor may be thin-film transistors (TFTs). The light-emitting element may be configured to emit light in proportion to the driving current from the driving transistor. The light-emitting element may be an organic light-emitting diode including an anode electrode, an organic emission layer, and a cathode electrode. The capacitor may maintain the data voltage applied to the gate electrode of the driving transistor at a constant level or amount.

The non-display area NDA may be defined as the area from the outer side of the display area DA to the edge of the display panel 100. In the non-display area NDA, a scan driver 410 for applying scan signals to scan lines SL, and pads DP connected to the data lines DL may be located or disposed. Because the circuit board 300 is attached to the pads DP, the pads DP may be located or disposed on one edge of the display panel 100, e.g., the lower edge of the display panel 100.

The scan driver 410 may be connected to the display driver 200 through a plurality of first scan control lines SCL1. The scan driver 410 may receive scan control signals from the pads DP through the plurality of first scan control wires SCL1. The scan driver 410 may generate scan signals according to the scan control signals and may sequentially output the scan signals to the scan lines SL. The sub-pixels SP to which the data voltages are supplied are selected by the scan signals of the scan driver 410 and the data voltages are supplied to the selected sub-pixels SP.

An emission control driver 420 may be connected to a display driver 200 through a plurality of second scan control lines SCL2. The emission control driver 420 may receive emission control signals from the pads DP through the plurality of second scan control lines SCL2. The emission control driver 420 may generate emission control signals according to the emission control signals and may sequentially output the emission control signals to the emission lines EL.

Although the scan driver 410 is located or disposed on an outer side of the display area DA, and the emission control driver 420 is located or disposed on the opposite side of the display area DA in the example shown in FIG. 2, the present disclosure is not limited thereto. Both the scan driver 410 and the emission control driver 420 may be located or disposed on an outer side of the display area DA or may be located or disposed on each of the outer sides of the display area DA.

The display driver 200 receives digital video data and timing signals from external devices. The display driver 200 converts the digital video data into analog positive/negative data voltages and supplies them to the data lines DL. The display driver 200 generates and supplies scan control signals for controlling the operation timing of the scan driver 410 through the first scan control lines SCL1. The display driver 200 generates and supplies emission control signals for controlling the operation timing of the emission control driver 420 through the second scan control lines SCL2. The display driver 200 may supply a first supply voltage to the first supply voltage lines VDDL.

The display driver 200 may be implemented as an integrated circuit (IC) and attached to the circuit board 300 by the chip-on-film (COF) technique. In some embodiments, the display driver 200 may be attached to the display panel 100 by chip-on-glass (COG) technique, chip-on-plastic (COP) technique, or ultrasonic bonding.

The circuit board 300 may be attached to the pads DP utilizing an anisotropic conductive film. In this manner, the lead lines of the circuit board 300 may be electrically connected to the pads DP. The circuit board 300 may be a flexible printed circuit board, a printed circuit board, or a flexible film such as a chip on film.

Figure 3:
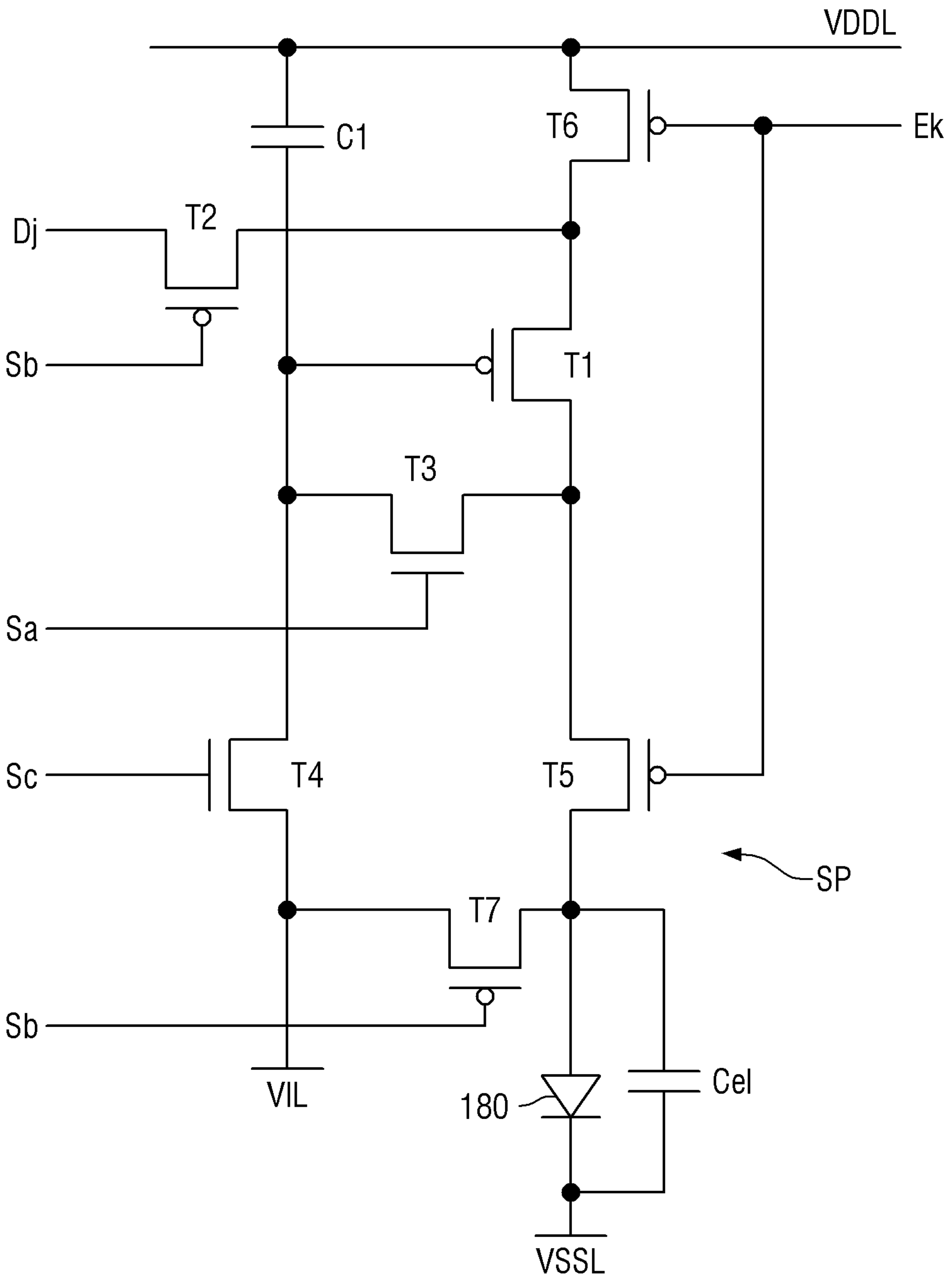
FIG. 3 is a circuit diagram of a sub-pixel according to an embodiment of the present disclosure.

FIG. 3 is a circuit diagram showing an example of one of the sub-pixels of FIG. 2. Referring to FIG. 3, a circuit of a sub-pixel SP of the display device may include an organic light-emitting diode 180, a plurality of transistors T1 to T7, and a capacitor C1. A data line Dj, a first scan line Sa, a second scan line Sb, a third scan line Sc, an emission line Ek, a first supply voltage line VDDL, a second supply voltage line VSSL, and an initializing voltage line VIL may be connected to the circuit of the sub-pixel.

The organic light-emitting diode 180 may include an anode electrode and a cathode electrode. The capacitor C1 may include a first electrode and a second electrode.

The plurality of transistors may include first to seventh transistors T1 to T7. Each of the transistors T1 to T7 may include a gate electrode, a first electrode, and a second electrode. One of the first electrode and the second electrode of each of the transistors T1 to T7 may be a source electrode while the other one may be a drain electrode.

Each of the transistors T1 to T7 may be a thin-film transistor. Each of the transistors T1 to T7 may be either a PMOS transistor or an NMOS transistor. In an embodiment, each of the first transistor T1 as a driving transistor, the second transistor T2 as a data transfer transistor, the fifth transistor T5 as a first emission control transistor, the sixth transistor T6 as a second emission control transistor and the seventh transistor T7 as a second initializing transistor are PMOS transistors. In an embodiment, each of the third transistor T3 as a compensating transistor, and the fourth transistor T4 as a first initializing transistor are NMOS transistors. The PMOS transistors and the NMOS transistors have different characteristics. The third transistor T3 and the fourth transistor T4 are implemented with NMOS transistors having a relatively good or suitable turn-off characteristic so that leakage of the driving current during the emission period of the organic light-emitting diode OLED can be reduced.

Hereinafter, each of the elements is described in more detail.

The gate electrode of the first transistor T1 is connected to the first electrode of the capacitor C1. The first electrode of the first transistor T1 is connected to the terminal of the first supply voltage VDDL via the sixth transistor T6. The second electrode of the first transistor T1 is connected to the anode electrode of the organic light-emitting diode 180 via the fifth transistor T5. The first transistor T1 receives the data signal DATA according to the switching operation of the second transistor T2 to supply the driving current to the organic light-emitting diode 180.

The gate electrode of the second transistor T2 is connected to the terminal of the second scan line Sb. The first electrode of the second transistor T2 is connected to the terminal of the data line Dj. The second electrode of the second transistor T2 is connected to the first electrode of the first transistor T1 and is connected to the terminal of the first supply voltage VDDL through the sixth transistor T6. The second transistor T2 performs switching operation in such a manner that it is turned on in response to a signal applied to the second scan line Sb to transfer a data signal applied through a data line Dj to the first electrode of the first transistor T1.

The gate electrode of the third transistor T3 is connected to the terminal of the first scan line Sa. The first electrode of the third transistor T3 is connected to the second electrode of the first transistor T1 and is connected to the anode electrode of the organic light-emitting diode 180 via the fifth transistor T5. The second electrode of the third transistor T3 is connected to the first electrode of the capacitor C1, the first electrode of the fourth transistor T4 and the gate electrode of the first transistor T1. The third transistor T3 is turned on in response to the signal of the first scan line Sa to connect the gate electrode with the second electrode of the first transistor T1, to diode-connect the first transistor T1. Accordingly, a voltage difference equal to the threshold voltage of the first transistor T1 is generated between the first electrode and the gate electrode of the first transistor T1. Deviations in the threshold voltage of the first transistor T1 can be compensated by supplying the data signal that compensates for the threshold voltage to the gate electrode of the first transistor T1.

The gate electrode of the fourth transistor T4 is connected to the terminal of the third scan line Sc. The second electrode of the fourth transistor T4 is connected to the terminal of the initializing voltage line VIL. The first electrode of the fourth transistor T4 is connected to the first electrode of the capacitor C1, the second electrode of the third transistor T3 and the gate electrode of the first transistor T1. The fourth transistor T4 is turned on in response to the signal of the third scan line Sc to transfer the initializing voltage signal of the initializing voltage line VIL to the gate electrode of the first transistor T1, to initialize the voltage at the gate electrode of the first transistor T1.

The gate electrode of the fifth transistor T5 is connected to the terminal of the emission line Ek. The first electrode of the fifth transistor T5 is connected to the second electrode of the first transistor T1 and the first electrode of the third transistor T3. The second electrode of the sixth transistor T6 is connected to the anode electrode of the organic light-emitting diode 180.

The gate electrode of the sixth transistor T6 is connected to the terminal of the emission line Ek. The first electrode of the sixth transistor T6 is connected to the terminal of the first supply voltage VDDL. The second electrode of the sixth transistor T6 is connected to the first electrode of the first transistor T1 and the second electrode of the second transistor T2.

The fifth transistor T5 and the sixth transistor T6 are concurrently (e.g., simultaneously) turned on in response to the emission control signal of the emission line Ek so that the driving current flows through the organic light-emitting diode 180.

The gate electrode of the seventh transistor T7 is connected to the terminal of the second scan line Sb. The first electrode of the seventh transistor T7 is connected to the anode electrode of the organic light-emitting diode 180. The second electrode of the seventh transistor T7 is connected to the terminal of the initializing voltage VIL. The seventh transistor T7 is turned on in response to the emission control signal of the emission line Ek to initialize the anode electrode of the organic light-emitting diode 180.

In an embodiment, the signal of the second scan line Sb is applied to the gate electrode of the seventh transistor T7. In some embodiments, the pixel circuit may be configured such that the emission control signal of the emission line Ek may be applied to the gate electrode of the seventh transistor T7.

The second electrode of the capacitor C1 is connected to the terminal of the first supply voltage line VDDL. The first electrode of the capacitor C1 is connected to the gate electrode of the first transistor T1, the second electrode of the third transistor T3 and the first electrode of the fourth transistor T4. The cathode electrode of the organic light-emitting diode 180 is connected to the terminal of the second supply voltage line VSSL. The organic light-emitting diode 180 displays an image by receiving a driving current from the first transistor T1 to emit light.

Each of the first to seventh transistors T1, T2, T3, T4, T5, T6 and T7 may include a semiconductor layer. In some embodiments, one or more of the first to seventh transistors T1, T2, T3, T4, T5, T6 and T7 may (e.g., may each) include a semiconductor layer made of polycrystalline silicon and one or more of the first to seventh transistors T1, T2, T3, T4, T5, T6 and T7 may (e.g., may each) include a semiconductor layer made of oxide. For example, the semiconductor layers of the first to seventh transistors T1, T2, T3, T4, T5, T6 and T7 may be made of polycrystalline silicon. In some embodiments, the semiconductor layers of the first transistor T1, the fifth transistor T5 to the seventh transistor T7 may be made of polycrystalline silicon and the semiconductor layers of the second transistor T2, the third transistor T3 and the fourth transistor T4 may be made of oxide. For example, the semiconductor layer of the driving transistor may include polycrystalline silicon, and the semiconductor layer of the switching transistor may include oxide.

The semiconductor layer of the switching transistor may include a first channel region overlapping the gate electrode of the switching transistor, a first drain region located on one side of the first channel region, and a first source region located on the other side of the first channel region. The semiconductor layer of the driving transistor may include a second channel region overlapping the gate electrode of the driving transistor, a second drain region located on one side of the second channel region, and a second source region located on the other side of the second channel region.

The display device 10 may include a flexible material, e.g., plastic, in order to implement the display device 10 that can be curved or bent. As a non-limiting example, the substrate may include polyimide. Polyimide may be utilized for a substrate for a variety of flexible display devices as a flexible insulating substrate. Unfortunately, for such a substrate including polyimide, charging phenomenon may occur, i.e., charges may be collected on the surface. Electrical characteristics of a thin-film transistor adjacent to the substrate may deteriorate due to such charging.

Described hereinafter is a display device (e.g., display device 10) that may prevent or reduce the electrical characteristics of thin-film transistors from deteriorating by enhancing or improving the charging phenomenon on the substrate.

Figure 4:
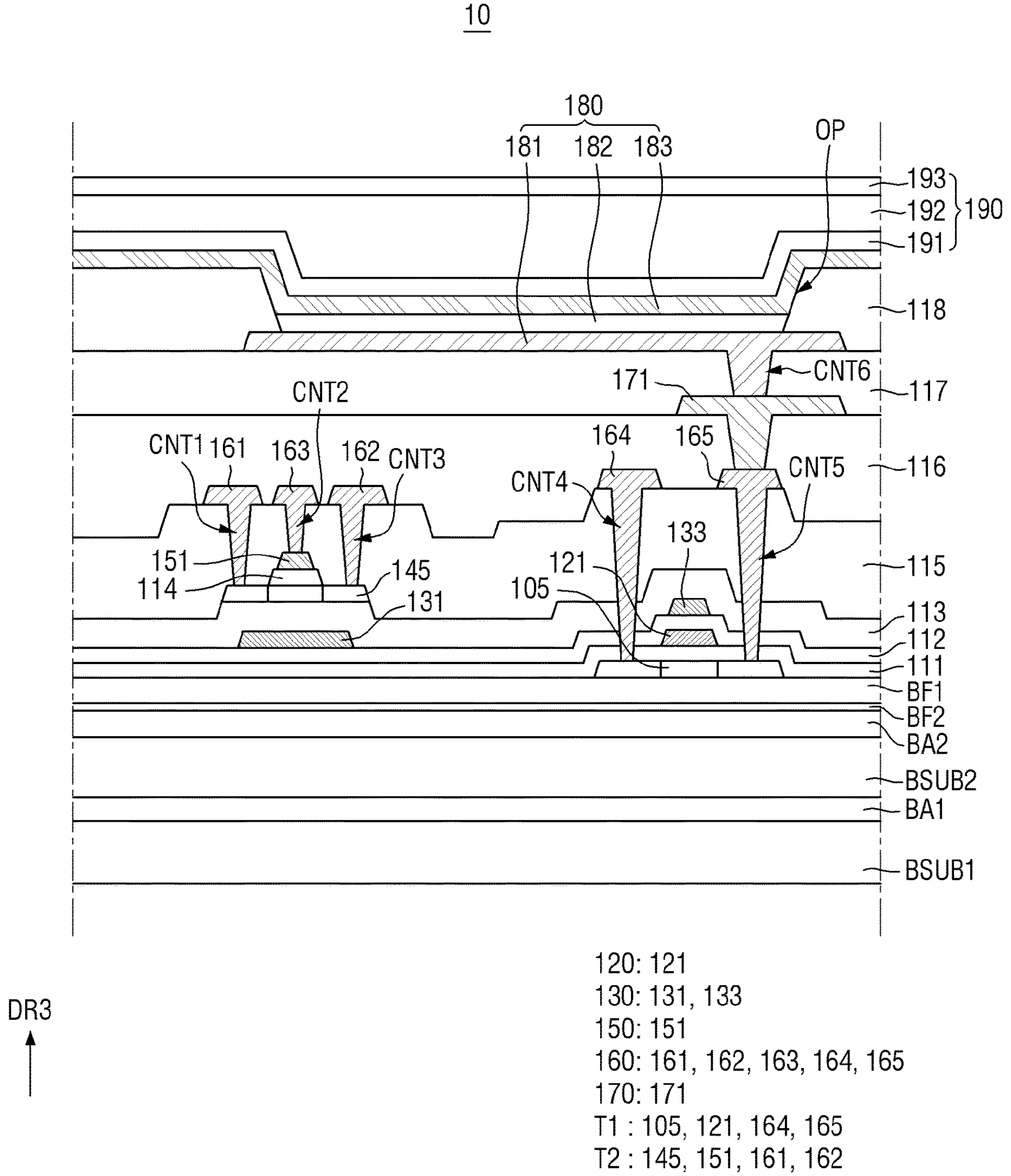
FIG. 4 is a cross-sectional view of a display device according to an embodiment of the present disclosure.

FIG. 4 is a cross-sectional view showing a display device according to an embodiment of the present disclosure. Referring to FIG. 4, the display device 10 according to an embodiment may include a first barrier layer BA1 disposed or located on a first base substrate BSUB1, a second base substrate BSUB2 disposed or located on the first barrier layer BA1, a second barrier layer BA2 disposed or located on the second base substrate BSUB2, a second buffer layer BF2 disposed or located on the second barrier layer BA2, a first buffer layer BF1 disposed or located on the second buffer layer BF2, a switching transistor ST disposed or located on the first buffer layer BF1, a driving transistor DT, and an organic light-emitting diode 180.

For example, the first base substrate BSUB1 supports the layers disposed or located thereon. The first base substrate BSUB1 may be utilized when the organic light-emitting display device is of a bottom-emission or both (e.g., simultaneously)-sided emission type or kind. When the organic light-emitting display device is of a top-emission type or kind, a semitransparent or opaque substrate as well as a transparent substrate may be employed. The first base substrate BSUB1 may include a flexible material such as plastic, and may be, for example, polyimide.

The first barrier layer BA1 may be disposed or located on the first base substrate BSUB1. The first barrier layer BA1 may be configured to prevent or reduce impurity ions from diffusing, prevent or reduce permeation of moisture and/or outside air, and/or provide a flat surface. The first barrier layer BA1 may include silicon nitride, silicon oxide, silicon oxynitride, and/or the like.

The second base substrate BSUB2 may be disposed or located on the first barrier layer BA1. The second base substrate BSUB2 may include a flexible material such as plastic, and may be, for example, polyimide.

The second base substrate BSUB2 may be an insulating substrate that is disposed or located close or proximal to transistors that are described in more detail elsewhere herein. When a voltage is applied to the gate electrode of each of the transistors, electrons are charged at the interface between the second base substrate BSUB2 and the second barrier layer BA2 disposed or located on the second base substrate BSUB2, such that an interfacial polarization may occur. If this happens, the electrons may be combined with residual electrical components existing in the drain signal of the transistors, such that the electrons at the interface may not disperse, or bypass, even after a period of time has elapsed. As a result, a residue image is created, i.e., a pattern remains. The term "afterimage," as utilized herein, is the residue image or pattern that remains. The afterimage may not disappear quickly even after stress is applied to a screen, and may cause the quality of the screen to deteriorate. To reduce or eliminate the formation or occurrence of afterimage, it may be contemplated to add a conductive member at, below, or under the transistor adjacent to the second base substrate BSUB2 to reduce electronic charging. To do so, an additional process is required to add the conductive member and an insulating layer for insulating the conductive member.

In the display device 10 according to the embodiment, the second base substrate BSUB2 has a dielectric constant of 3.5 or less, or 3.0 or less. In an embodiment, the second base substrate BSUB2 may be configured to reduce electron charging and suppress interfacial polarization without (in the absence of) an additional process.

A condition that causes interfacial polarization at the interface between the second base substrate BSUB2 and the second barrier layer BA2 may be expressed by the following relational expression:

$$\varepsilon_1 p_1 \neq \varepsilon_2 p_2 \qquad \text{Relational Expression}$$

where $\varepsilon_1$ denotes the dielectric constant of the second base substrate BSUB2, $p_1$ denotes the specific resistance of the second base substrate BSUB2, $\varepsilon_2$ denotes the dielectric constant of the second barrier layer BA2, and $p_2$ denotes the specific resistance of the second barrier layer BA2.

Referring to the above relational expression, interfacial polarization occurs or is caused when the value of $\varepsilon_1 p_1$ is not In an embodiment, the second base substrate BSUB2 may include a polyimide resin. The polyimide resin can be produced through the synthesis of a polyimide. For example, the synthesis of the polyimide may include contacting a dianhydride monomer and a diamine monomer in the presence of a solvent (e.g., N-methyl pyrrolidine (NMP)) and a condensation polymerization in the solvent to produce a polyamic acid. The term "polyamic acid," as utilized herein, is a polyamide having a carboxyl group and/or a carboxylic acid functional group. The synthesis of the polyimide may include an imidization reaction (i.e., a dehydration reaction) of the obtained polyamic acid, (e.g., at elevated temperature), to produce the polyimide, as expressed in Scheme 1:

Scheme 1

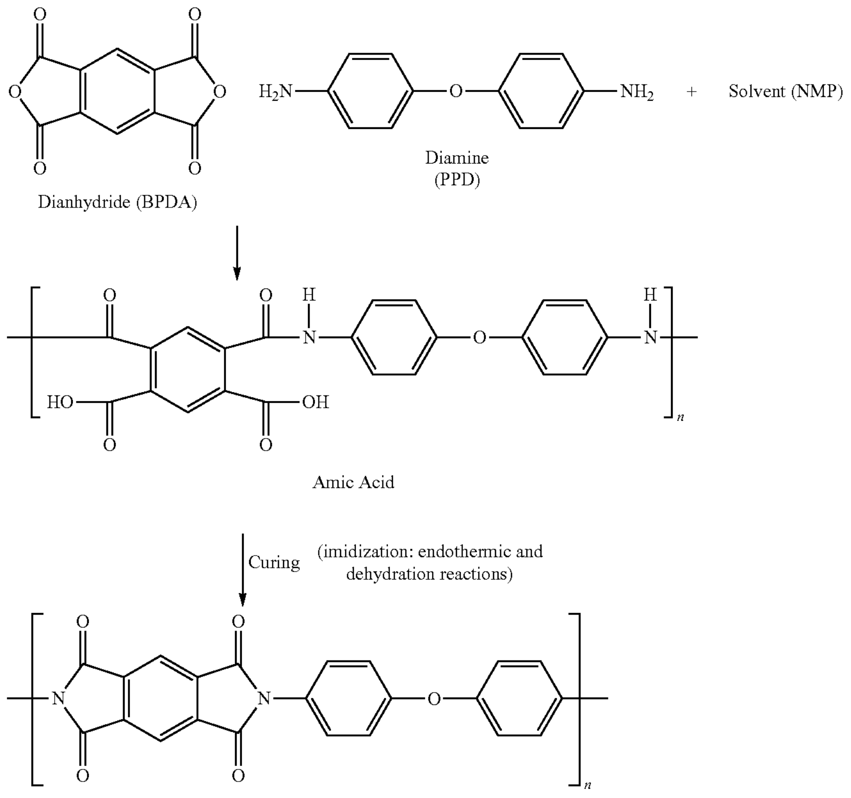

Dianhydride (BPDA)

Diamine (PPD)

Amic Acid

Imide Group equal to the value of $\varepsilon_2 p_2$. In contrast, when the value of $\varepsilon_1 p_1$ is equal to the value of $\varepsilon_2 p_2$, interfacial polarization does not occur. The interfacial polarization gradually decreases as the difference between the values of $\varepsilon_1 p_1$ and $\varepsilon_2 p_2$ decreases. Accordingly, the interfacial polarization can be suppressed or reduced by utilizing a second base substrate BSUB2 having a reduced or decreased dielectric constant to thereby reduce or decrease a difference between the value of $\varepsilon_1 p_1$ and the value of $\varepsilon_2 p_2$.

The dielectric constant of the second base substrate BSUB2 may be less than the dielectric constant of the first base substrate BSUB1. The first base substrate BSUB1 is disposed or located farther or distal from the thin-film transistor than the second base substrate BSUB2. Accordingly, electron charging at the interface of the first base substrate BSUB1 may be negligible or ignorable.

In an embodiment, the dianhydride monomer may be selected from the group consisting of: pyromellitic dianhydride; 2,3,6,7-naphthalenetetracarboxylic dianhydride; 1,2,5,6-naphthalenetetracarboxylic dianhydride; 1,4,5,8-naphthalenetetracarboxylic dianhydride; 3,3'4,4'-biphenyltetracarboxylic dianhydride; 2,3,2',3'-biphenyltetracarboxylic dianhydride, bis(3,4-dicarboxyphenyl)ether dianhydride; bis(3,4-dicarboxyphenyl)diphenylsulfone dianhydride; bis(3,4-dicarboxyphenyl)methane dianhydride; 2,2-bis(3,4-dicarboxyphenyl)propane dianhydride; 1,1,1,3,3,3-hexafluoro-2,2-bis(3,4-dicarboxyphenyl)propane dianhydride; bis(3,4-dicarboxyphenyl)dimethyl silane dianhydride; 2,3,4,5-pyridinetetracarboxylic dianhydride; 1,2,3,4-butanetetracarboxylic dianhydride; 1,2,3,4-cyclobutanetetracarboxylic dianhydride; 1,2,3,4-cyclopentanetetracarboxylic dianhydride; 1,2,4,5-cyclohexanetetracarboxylic dianhydride; 2,3,5-tricarboxycyclopentylacetic acid dianhydride; 3,4-dicarboxy-1,2,3,4-tetrahydro-1-naphthalenesuccinic dianhydride; and derivatives thereof.

In an embodiment, the diamine monomer may be selected from the group consisting of: 2,5-diaminobenzonitrile; 2-(trifluoromethyl)-1,4-benzenediamine; p-phenylenediamine; 2-chloro-1,4-benzenediamine; 2-fluoro-1,4-benzenediamine; m-phenylenediamine; 2,5-diaminotoluene; 2,6-diaminotoluene; 4,4'-diaminobiphenyl; 3,3'-dimethyl-4,4'-diaminobiphenyl; 3,3'-dimethoxy-4,4'-diaminobiphenyl; diaminodiphenylmethane; diaminodiphenyl ether; 2,2-diaminodiphenylpropane; bis(3,5-diethyl-4-aminophenyl) methane; diaminodiphenylsulfone; diaminonaphthalene; 1,4-bis(4-aminophenoxy)benzene; 4,4'-diaminobenzophenone; 3,4'-diaminobenzophenone; 1,4-bis(4-aminophenyl) benzene; 9,10-bis(4-aminophenyl)anthracene; 1,3-bis(4-aminophenoxy)benzene; 4,4'-bis(4-aminophenoxy) diphenylsulfone; 2,2-bis[4-(4-aminophenoxy)phenyl] propane; 2,2-bis(4-aminophenyl)hexafluoropropane; 2,2-bis [4-(4-aminophenoxy)phenyl]hexafluoropropane; bis(4-aminocyclohexyl)methane; tetramethylenediamine; hexamethylene diamine; bis(3-aminopropyl) tetramethyldisiloxane; and derivatives thereof.

In an embodiment, the solvent may be dimethylfuran (DMF) or N-methyl pyrrolidone (NMP).

The polyimide composition thus prepared may be coated on a substrate. It may be coated via a solution process such as spin coating, spray coating and slit coating.

The coated polyimide thin film may be produced into a polyimide thin film via a curing process. The curing process may be carried out for several minutes to several hours at elevated temperature, e.g., temperature of 470° C. or more.

According to the embodiment of the present disclosure, the polyimide resin utilized for the second base substrate BSUB2 may have low dielectric constant and high transmittance. To this end, the polyimide resin may have one or more of the characteristics described herein.

In an embodiment, the polyimide resin may have a bent molecular structure. As utilized herein, a bent molecular structure refers to a structure in which linking parts between dianhydride and diamine do not form a linear structure and/or a structure in which linking parts in diamine or dianhydride do not form a linear structure. For example, ortho-phenylene (o-phenylene) and meta-phenylene (m-phenylene) may each have a bent molecular structure, whereas para phenylene (p-phenylene) does not have a bent molecular structure. Instead the linking parts of p-phenylene form a linear structure.

When the polyimide resin has a bent molecular structure, the density between the polyimide molecules is reduced, so that a space through which light can pass can be obtained. For example, the light transmittance of the polyimide resin having the bent molecular structure may be enhanced or improved. In an embodiment, the light transmittance of the second base substrate BSUB2 made of the polyimide resin having the bent molecular structure may be enhanced or improved.

Non-limiting examples of the polyimide resin having the bent molecular structure include the following compounds:

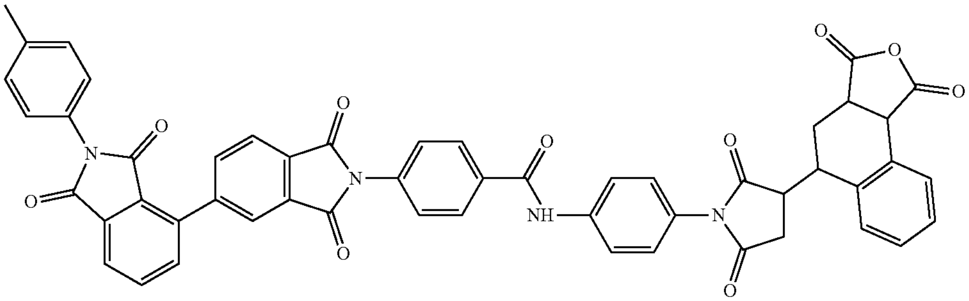

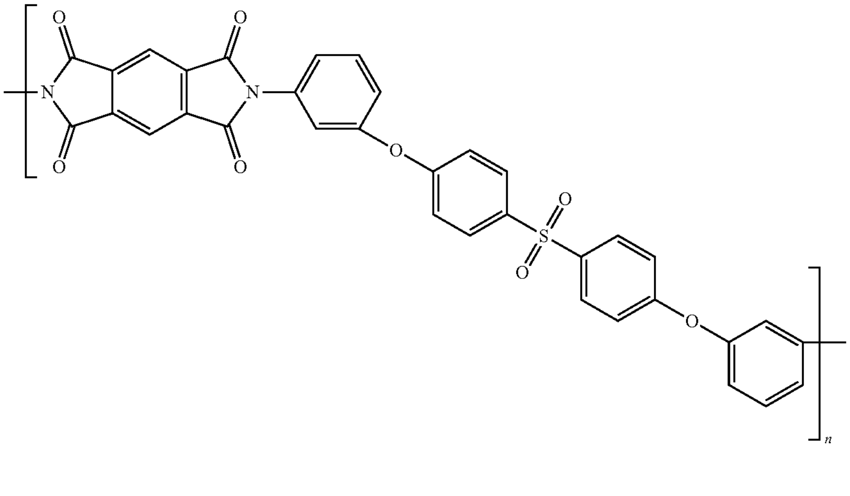

In an embodiment, the polyimide resin may contain fluorine atoms, i.e., a fluorine substituent may be included at a terminal portion of the polyimide resin. For example, $CF_3$ may be bonded to the terminal portion of a dianhydride or $CF_3$ may be bonded to the terminal portion of a diamine.

The polyimide resins have π electrons in a benzene ring that can move freely within the molecule. When π electrons exist in a polyimide, which is a non-conductor, electric charges may be collected during driving of the thin-film transistor as described in more detail elsewhere herein. According to an embodiment of the present disclosure, free movement of π electrons may be suppressed or reduced by including fluorine atoms having high electronegativity. In doing so, it is possible to lower the probability of capturing other electrons in the second base substrate BSUB2, thereby decreasing the dielectric constant of the second base substrate BSUB2.

Non-limiting examples of the polyimide resin containing fluorine atoms include the following compounds:

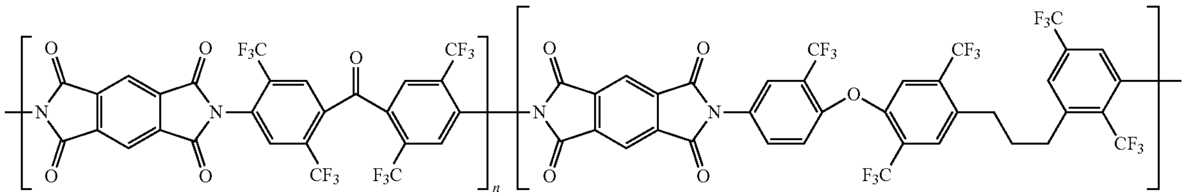

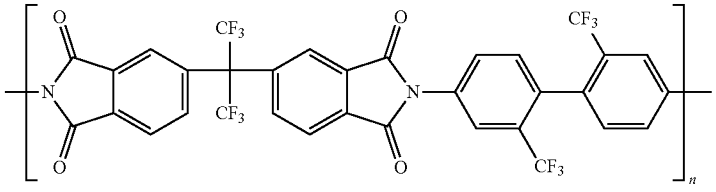

In an embodiment, the polyimide resin may include at least one aliphatic ring, i.e., the molecular structure of the main chain of the polyimide resin is aliphatic rather than aromatic. For example, in such a molecular structure, a benzene ring of a dianhydride or a benzene ring of a diamine may be substituted with a cyclohexane ring.

An aromatic ring may form a planar structure in a two-dimensional molecular structure, whereas an aliphatic ring may form a spatial structure in a three-dimensional molecular structure. When the polyimide resin has a three-dimensional molecular structure, the density between the polyimide molecules is reduced, so that a space through which light can pass may be obtained. For example, the light transmittance of the polyimide resin having a three-dimensional structure may be enhanced or improved. In an embodiment, the light transmittance of the polyimide resin having at least one aliphatic ring may be enhanced or improved.

In an embodiment, the polyimide resin including an aliphatic ring may have a dianhydride structure, for example, as follows:

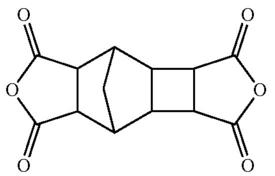

-continued

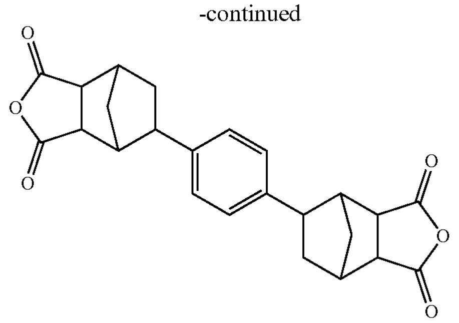

The polyimide resin forming the second base substrate BSUB2 may satisfy the following physical properties:

i) dielectric constant: 3.5 or less ii) glass transition temperature: 350° C. or greater (e.g., higher)

iii) thermal decomposition temperature when the weight loss rate is 1%: 450° C. or greater (e.g., more)

iv) coefficient of thermal expansion: 20 ppm/° C. or less v) transmittance of light with the wavelength of 450 nm: 85% or greater (e.g., more)

vi) Young's modulus: 5 GPa or greater (e.g., more)

vii) elongation: 15% or greater (e.g., more)

As described above, the second base substrate BSUB2 according to this embodiment includes the polyimide resin having the bent molecular structure, the structure containing fluorine, and/or the structure containing an aliphatic ring. In an embodiment, the dielectric constant of the second base substrate BSUB2 may be decreased and the light transmittance may be enhanced or improved. In some embodiments, the mask process is not required (or may not be provided) as a result of eliminating the conductive member. The conductive member may be utilized to block or reduce light. The conductive member may be utilized to block or reduce an electric field to suppress or reduce electron charging.

Returning to FIG. 4, the second barrier layer BA2 may be located or disposed on the first sub-substrate SSUB1. The second barrier layer BA2 can prevent or reduce impurity ions from diffusing, can prevent or reduce permeation of moisture and/or outside air, and can provide a flat surface. The second barrier layer BA2 may include silicon nitride, silicon oxide, silicon oxynitride, and/or the like.

The second buffer layer BF2 may be disposed or located on the second barrier layer BA2. The second buffer layer BF2 serves to supply hydrogen to a polysilicon semiconductor layer 105 to be described later. The second buffer layer BF2 may include silicon nitride, silicon oxide, silicon oxynitride, and/or the like. In an embodiment, the second buffer layer BF2 may include silicon nitride.

The first buffer layer BF1 may be disposed or located on the second buffer layer BF2. The first buffer layer BF1 may include silicon nitride, silicon oxide, silicon oxynitride, and/or the like. The first barrier layer BA1, the second barrier layer BA2, the second buffer layer BF2 and the first buffer layer BF1 may be inorganic film layers.

The polysilicon semiconductor layer 105 may be disposed or located on the buffer layer 1. The polysilicon semiconductor layer 105 may be made of amorphous silicon or a polysilicon. The crystalline silicon may be produced by crystallizing amorphous silicon. Examples of the crystallizing techniques may include, but are not limited to, rapid thermal annealing (RTA), solid phase crystallization (SPC), excimer laser annealing (ELA), metal induced crystallization (MIC), metal induced lateral crystallization (MILC), sequential lateral solidification (SLS), etc.

The polysilicon semiconductor layer 105 may include a second channel region overlapping the second gate electrode 121 in the thickness direction, i.e., the third direction DR3, a second drain region located on one side of the second channel region, and a second source region located on the other side of the second channel region.

According to an embodiment of the present disclosure, no conductive member may be disposed or located between the polysilicon semiconductor layer 105 and the second substrate BSUB2. In an embodiment, the second substrate BSUB2 has a low dielectric constant, the electric field is blocked and accordingly the electron charging does not occur. Therefore, no conductive member is required and thus the mask process may not be included.

A lower gate insulating layer 111 may be disposed or located at (e.g., on) the polysilicon semiconductor layer 105. The lower gate insulating layer 111 may be a gate insulating film having a gate insulating function. The lower gate insulating layer 111 may include a silicon compound, a metal oxide, etc. For example, the lower gate insulating layer 111 may include silicon oxide, silicon nitride, silicon oxynitride, aluminum oxide, tantalum oxide, hafnium oxide, zirconium oxide, titanium oxide, etc. They may be utilized alone or in combinations. The lower gate insulating layer 111 may be made up of a single layer or multiple layers of different materials stacked on one another.

A first conductive layer 120 may be disposed or located on the lower gate insulating layer 111. The first conductive layer 120 may include the second gate electrode 121. The first conductive layer 120 may include at least one metal selected from the group consisting of: molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The first conductive layer 120 may include (e.g., be made up of) a single layer or multiple layers.

An upper gate insulating layer 112 may be disposed or located on the first conductive layer 120 including the second gate electrode 121. The upper gate insulating layer 112 may be a gate insulating film having a gate insulating function. The upper gate insulating layer 112 may include a silicon compound, a metal oxide, etc. For example, the upper gate insulating layer 112 may include silicon oxide, silicon nitride, silicon oxynitride, aluminum oxide, tantalum oxide, hafnium oxide, zirconium oxide, titanium oxide, etc. They may be utilized alone or in combinations. The upper gate insulating layer 112 may include (e.g., be made up of) a single layer or multiple layers of different materials stacked on one another.

A second conductive layer 130 may be disposed or located on the upper gate insulating layer 112. The second conductive layer 130 may include at least one metal selected from the group consisting of: molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The second conductive layer 130 may include (e.g., be made up of) a single layer or multiple layers.

The second conductive layer 130 may include a first lower gate electrode 131 and a capacitor electrode 133. The first lower gate electrode 131 may be located or disposed to overlap with the first channel region of the oxide semiconductor layer 145 in the thickness direction. The capacitor electrode 133 may be located or disposed to overlap with the second channel region of the polysilicon semiconductor layer 105 in the thickness direction.

A lower interlayer dielectric layer 113 may be disposed or located on the second conductive layer 130. The lower interlayer dielectric layer 113 may include a silicon compound, a metal oxide, etc. For example, the lower interlayer dielectric layer 113 may include silicon oxide, silicon nitride, silicon oxynitride, aluminum oxide, tantalum oxide, hafnium oxide, zirconium oxide, titanium oxide, etc. They may be utilized alone or in combinations. The lower interlayer dielectric layer 113 may include (e.g., be made up of) a single layer or multiple layers of different materials stacked on one another.

The oxide semiconductor layer 145 may be disposed or located on the lower interlayer dielectric layer 113. The oxide semiconductor layer 145 may include an oxide. The oxide may include one or more oxides selected from zinc (Zn), indium (In), gallium (Ga), tin (Sn) cadmium (Cd), germanium (Ge) hafnium (Hf), and/or a combination thereof. The oxide may include at least one of indium-gallium-zinc oxide (IGZO), zinc-tin oxide (ZTO), indium-tin oxide (IZO), and/or the like.

A first gate insulating layer 114 may be disposed or located on the oxide semiconductor layer 145. The first gate insulating layer 114 may be a gate insulating film having a gate insulating function. The first gate insulating layer 114 may include a silicon compound, a metal oxide, etc. For example, the first gate insulating layer 114 may include silicon oxide, silicon nitride, silicon oxynitride, aluminum oxide, tantalum oxide, hafnium oxide, zirconium oxide, titanium oxide, etc. They may be utilized alone or in combinations. The first gate insulating layer 114 may include (e.g., be made up of) a single layer or multiple layers of different materials stacked on one another.

A portion of the upper surface of the first source region and the first drain region of the oxide semiconductor layer 145 may be exposed by the first gate insulating layer 114. The first gate insulating layer 114 may be located or disposed to overlap the first channel region of the oxide semiconductor layer 145 in the thickness direction and/or may be located or disposed to not overlap the first source region and the first drain region.

A second conductive layer 150 may be disposed or located on the first gate insulating layer 114. The second conductive layer 150 may include at least one metal selected from the group consisting of: molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The second conductive layer 150 may include (e.g., be made up of) a single layer or multiple layers.

The second conductive layer 150 may include a first upper gate electrode 151. The first upper gate electrode 151 may be disposed or located to overlap the first gate insulating layer 114 in the thickness direction.

According to an embodiment of the present disclosure, the gate electrode of the switching transistor may be a double gate electrode including a first upper gate electrode 151 and a first lower gate electrode 131. The first upper gate electrode 151 may be electrically connected to the first lower gate electrode 131. The capacitor electrode 133 and the second gate electrode 121 may form a capacitor by interposing the upper gate insulating layer 112 therebetween.

An upper interlayer dielectric layer 115 may be disposed or located on the second conductive layer 150. The upper interlayer dielectric layer 115 may cover the first upper gate electrode 151, the side surfaces of the first gate insulating layer 114, and the exposed upper surface of the oxide semiconductor layer in the first source region and the first drain region. The upper interlayer dielectric layer 115 may include a silicon compound, a metal oxide, etc. For example, the upper interlayer dielectric layer 115 may include silicon oxide, silicon nitride, silicon oxynitride, aluminum oxide, tantalum oxide, hafnium oxide, zirconium oxide, titanium oxide, etc. They may be utilized alone or in combinations. The upper interlayer dielectric layer 115 may include (e.g., be made up of) a single layer or multiple layers of different materials stacked on one another.

The fourth conductive layer 160 may be disposed or located on the upper interlayer dielectric layer 115. The fourth conductive layer 160 may include at least one metal selected from the group consisting of: molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The fourth conductive layer 160 may include (e.g., be made up of) a single layer or multiple layers.

The fourth conductive layer 160 may include a first source electrode 161, a first drain electrode 162, a second source electrode 164, and a second drain electrode 165. The fourth conductive layer 160 may further include a first connection electrode 163.

The first source electrode 161 and the first drain electrode 162 may be connected to the first source region and the first drain region through the contact holes CNT1 and CNT2 penetrating the upper interlayer insulating layer 115, respectively. The second source electrode 164 and the second drain electrode 165 may be connected to the second source region and the second drain region of the polysilicon semiconductor layer 105 through the contact holes CNT4 and CNt5 penetrating the upper interlayer dielectric layer 115, the lower interlayer dielectric layer 113 and the gate insulating layers 111 and 112, respectively.

The first connection electrode 163 may be connected to the first upper gate electrode 151 through a third contact hole CNT3 penetrating through the upper interlayer dielectric layer 115. The first connection electrode 163 is electrically connected to the first upper gate electrode 151, so that the resistance of the first upper gate electrode 151 can be reduced.

Accordingly, the first transistor T1 including the polysilicon semiconductor layer 105, the first gate electrode 121, the second source electrode 164 and the second drain electrode 165 may be formed, and the second transistor T2 including the oxide semiconductor layer 145, the second gate electrode 151, the first source electrode 161 and the first drain electrode 162 may be formed.

A first via layer 116 may be disposed or located over the fourth conductive layer 160. The first via layer 116 may include an inorganic insulating material or an organic insulating material such as polyacrylate resin, epoxy resin, phenolic resin, polyamide resin, polyimide resin, unsaturated polyesters resin, poly phenylen ether resin, poly phenylene sulfide resin, and/or benzocyclobutene (BCB). The first via layer 116 may include (e.g., be made up of) a single layer or multiple layers of different materials stacked on one another.

A fifth conductive layer 170 may be disposed or located on the first via layer 116. The fifth conductive layer 170 may include a second connection electrode 171. The fifth conductive layer 170 may include at least one metal selected from the group consisting of: molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The fifth conductive layer 170 may include (e.g., be made up of) a single layer or multiple layers.

The second connection electrode 171 may be connected to the second drain electrode 165 through a sixth contact hole CNT6 that partially penetrates the first via layer 116 to expose the upper surface of the second drain electrode 165.

An anode electrode 181 may be disposed or located on the first via layer 116. The anode electrode 181 may be connected to the second connection electrode 171 through a contact hole penetrating the first via layer 116. The anode electrode 181 may be separately disposed or located for each sub-pixel SP (see FIG. 2).

A bank layer 118 may be disposed or located on the anode electrode 181. The bank layer 118 may include an opening OP partially exposing the anode electrode 181. The bank layer 118 may include (e.g., be made of) an organic insulating material and/or an inorganic insulating material. For example, the bank layer 118 may include at least one of a photoresist, a polyimide resin, an acrylic resin, a silicon compound, a polyacrylic resin, and/or the like.

An organic emission layer 182 may be disposed or located on the upper surface of the anode electrode 181 and in the opening OP of the bank layer 118. A cathode electrode 183 may be disposed or located on the organic emission layer 182 and the bank layer 118. The cathode electrode 183 may be a common electrode disposed across a plurality of pixels.

A pixel electrode ANO, the organic emission layer 182 and the cathode electrode 183 may form an organic light-emitting diode 180.

An encapsulation layer 190 may be disposed or located on the cathode electrode 183. The encapsulation layer 190 may cover the organic light-emitting diode 180. The encapsulation layer 190 may be a stack of inorganic layers and organic layers alternately stacked on one another. For example, the encapsulation layer 190 may include a first inorganic encapsulation layer 191, an organic encapsulation layer 192 and a second inorganic encapsulation layer 193 stacked on one another in this order.

Returning to FIG. 4, in an embodiment of the display device 10, both (e.g., simultaneously) the first base substrate BSUB1 and the second base substrate BSUB2 may include the polyimide resin as described herein. In an embodiment, the first base substrate BSUB1 includes a polyimide resin that is substantially the same as a polyimide resin included in the second base substrate BSUB2. In an embodiment, the first base substrate BSUB1 includes a polyimide resin that is different than the polyimide resin included in the second base substrate BSUB2.

In the display device 10 according to the embodiment, a sensor device may be disposed below or under the first base substrate BSUB1. The sensor device may be a sensor utilizing light or sound. The sensor device may be, for example, a sensor for measuring distance, such as a proximity sensor, a sensor for recognizing a portion of a user's body (e.g., a fingerprint, an iris, a face, etc.), a small lamp for outputting light, and/or an image sensor for capturing an image (e.g., a camera). The sensor device utilizing light may utilize lights in one or more suitable wavelength bands such as visible light, infrared light, and ultraviolet light. The sensor device utilizing sound may utilize ultrasonic waves or sounds in other frequency bands.

Each of the first base substrate BSUB1 and the second base substrate BSUB2 according to this embodiment includes the polyimide resin having the bent molecular structure, the structure containing fluorine, and/or the structure containing an aliphatic ring, so that the dielectric constant of each of the first base substrate BSUB1 and the second base substrate BSUB2 can be decreased, and the light transmittance can be enhanced or improved.

Accordingly, light and/or other electromagnetic radiation that is output and/or reflected (e.g., incident) from the sensor device can be transmitted without being hindered from the first base substrate BSUB1 and the second base substrate BSUB2 of the display device 10. In an embodiment, one or more sensing characteristics of the display device 10 can be enhanced or improved.

Terms such as "substantially," "about," and "approximately" are used as relative terms and not as terms of degree, and are intended to account for the inherent deviations in measured or calculated values that would be recognized by those of ordinary skill in the art. They may be inclusive of the stated value and an acceptable range of deviation as determined by one of ordinary skill in the art, considering the limitations and error associated with measurement of that quantity. For example, "about" may refer to one or more standard deviations, or ±30%, 20%, 10%, 5% of the stated value.

Numerical ranges disclosed herein include and are intended to disclose all subsumed sub-ranges of the same numerical precision. For example, a range of "1.0 to 10.0" includes all subranges having a minimum value equal to or greater than 1.0 and a maximum value equal to or less than 10.0, such as, for example, 2.4 to 7.6. Applicant therefore reserves the right to amend this specification, including the claims, to expressly recite any sub-range subsumed within the ranges expressly recited herein.

The display device or any other relevant devices or components according to embodiments of the present disclosure described herein may be implemented utilizing any suitable hardware, firmware (e.g., an application-specific integrated circuit), software, or a combination of software, firmware, and hardware. For example, the various components of the display device may be formed on one integrated circuit (IC) chip or on separate IC chips. Further, the various components of the display device may be implemented on a flexible printed circuit film, a tape carrier package (TCP), a printed circuit board (PCB), or formed on one substrate. Further, the various components of the display device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the embodiments of the present disclosure.

Hereinafter, Examples and Experimental Examples for the base substrate and the display device according to the above-described embodiment will be described in more detail.

EXAMPLES

Example 1: Preparation of Polyimide Thin Films

Sample #1

A dianhydride compound was contacted with a diamine compound to produce polyimide resin PR-1. Sample #1 was produced from polyimide resin PR-1 being coated and cured on a glass substrate, to form a thin film (polyimide thin film) having a thickness of 10 micrometer (μm).

PR-1

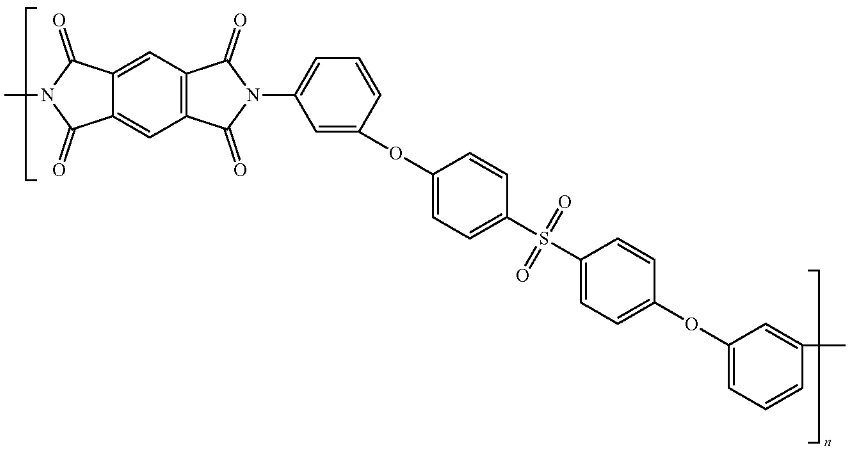

Comparative Example 1

Comparative Example 1 was prepared as described for Sample #1 except that the dianhydride and a diamine compounds were selected as needed to prepare polyimide resin PR-2. Comparative Example 1 had the same thickness as Sample #1.

Comparative Example 2

Comparative Example 2 is a display device that was fabricated as described for Sample #2 except that the polyimide of Comparative Example 1 prepared in Example 1 was utilized.

PR-2

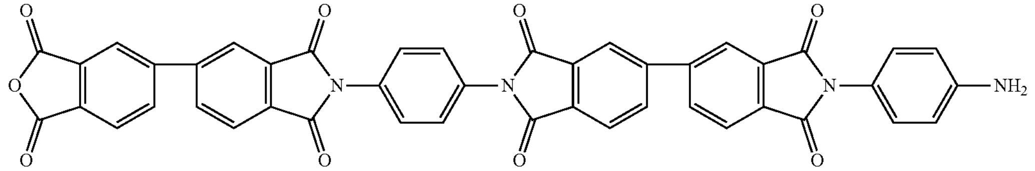

Experimental Example 1: Measurement of Dielectric Constant and Transmittance of Polyimide Thin Films The dielectric constants of the polyimide thin films according to Sample #1 and Comparative Example 1 were measured as shown in FIG. 5, and the transmittance was measured as shown in FIG. 6.

Figure 5:
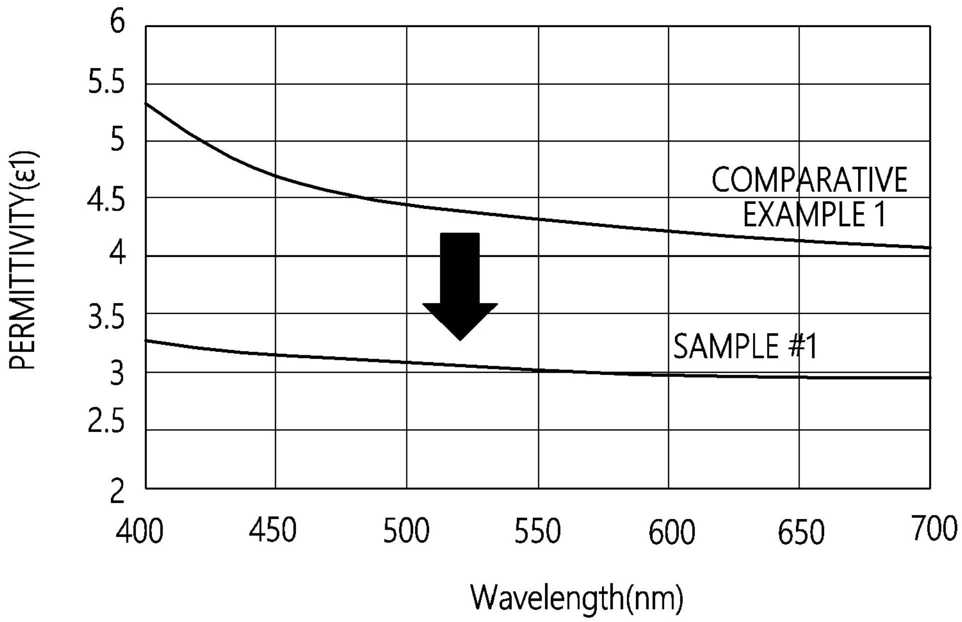
FIG. 5 is a graph of the dielectric constant of polyimide thin films according to Sample #1 and Comparative Example 1.
Figure 6:
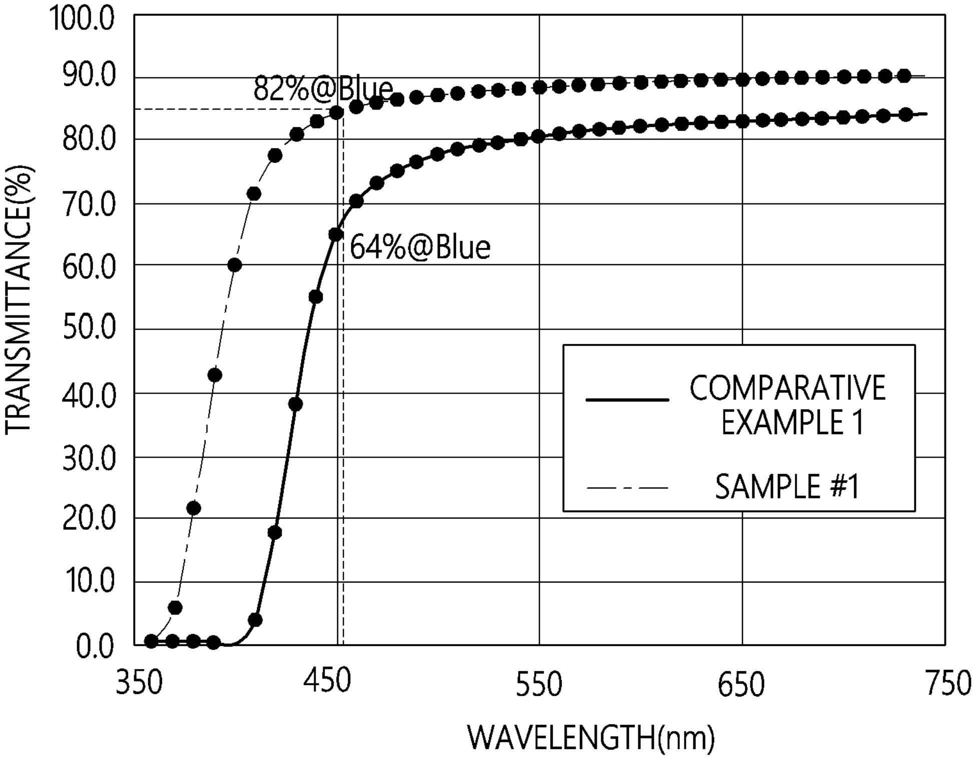
FIG. 6 is a graph of the transmittance of polyimide thin films according to Sample #1 and Comparative Example 1.

FIG. 5 is a graph showing the dielectric constant of polyimide thin films according to Sample #1 and Comparative Example 1. FIG. 6 is a graph showing the transmittance of polyimide thin films according to Sample #1 and Comparative Example 1.

FIG. 5 shows that the polyimide thin film according to Comparative Example 1 exhibited a dielectric constant of approximately (about) 4 to (about) 5.5 at wavelengths of 400 nm to 700 nm. The polyimide thin film according to Sample #1 exhibited a dielectric constant of approximately (about) 2.9 to (about) 3.3 at wavelengths of 400 nm to 700 nm.

It may be seen from the above that the dielectric constant of the polyimide thin film according to Sample #1 was decreased by approximately (about) 0.7 to (about) 2.6 compared to the dielectric constant of the polyimide thin film according to Comparative Example 1.

Referring to FIG. 6, the polyimide thin film according to Comparative Example 1 exhibited a transmittance of approximately (about) 64% for the light having the wavelength of approximately (about) 450 nm. The polyimide thin film according to Sample #1 exhibited a transmittance of approximately (about) 85% for the light having the wavelength of approximately (about) 450 nm.

It can be seen from the above that the transmittance of the polyimide thin film according to Sample #1 was increased by approximately (about) 32% compared to the dielectric constant of the polyimide thin film according to Comparative Example 1.

Example 2: Fabrication of Display Devices

Sample #2 and Sample #3

Sample #2 and Sample #3 are display devices that were fabricated from a first base substrate that was the polyimide film of Sample #1 (Example 1) with the thickness of 10 μm, and a second base substrate that was the polyimide film of Sample #1 with the thickness of 5.6 μm.

Experimental Example 2: Evaluation of Moment Afterimage and Mid to Long Term Afterimage of Display Devices The moment afterimage was evaluated for the display devices according to Sample #2, Sample #3 and Comparative Example 2, and the mid to long term afterimage Figure Of Merit (ISFOM) was evaluated for the display devices according to Sample #2 and Comparative Example 2.

The moment afterimage was evaluated as follows: the screen of the display device was divided into two parts, in which black and white are displayed for 10 seconds, respectively, and then was driven with 48 grayscale. As a result, a luminance difference was created, which decreased over time. In doing so, the time at which the luminance difference reaches 0.4% was measured.

The mid to long term afterimage was evaluated as follows: the screen of the display device was divided into two parts, in which black and white are displayed for 30 minutes, respectively, and then was driven with 31 grayscale. As a result, a luminance difference was created, which decreased over time. The mid to long term afterimage was measured after 300 seconds has elapsed. The mid to long term afterimage is improved as the ISFOM value approaches zero.

Figure 7:
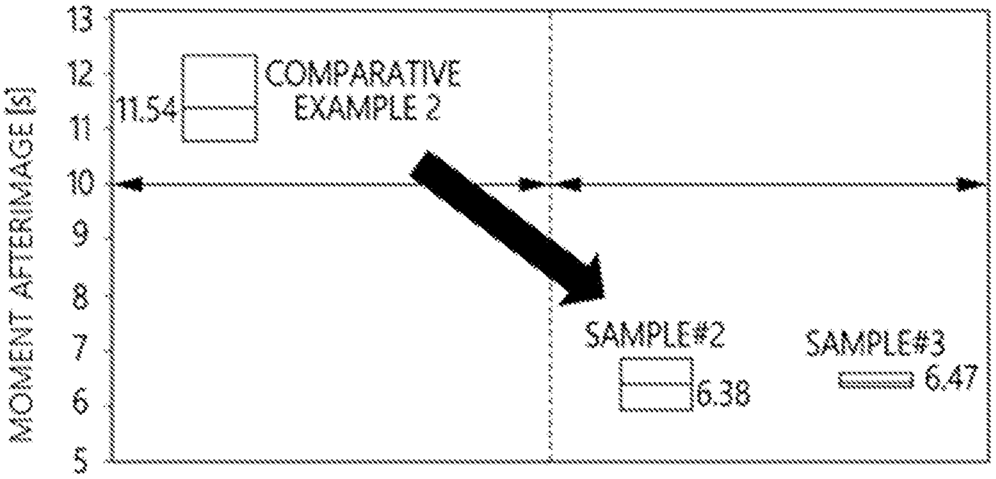
FIG. 7 is a graph of measuring the moment afterimage of display devices according to Sample #2, Sample #3, and Comparative Example 2.
Figure 8:
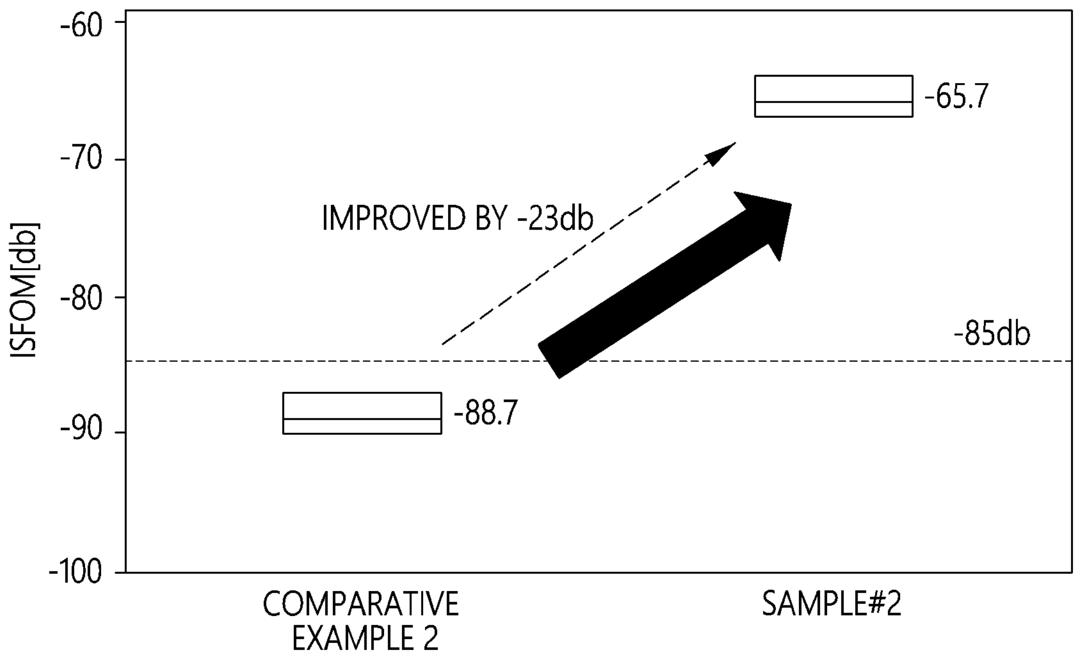
FIG. 8 is a graph of measuring the mid to long term afterimage of display devices according to Sample #2 and Comparative Example 2.

FIG. 7 is a graph showing results of measuring moment afterimages of display devices according to Sample #2, Sample #3, and Comparative Example 2. FIG. 8 is a graph showing results of measuring mid to long term afterimage of display devices according to Sample #2 and Comparative Example 2.

Referring to FIG. 7, the display device according to Comparative Example 2 exhibited a moment afterimage time of approximately (about) 11.54 seconds. The display device according to Sample #2 exhibited a moment afterimage time of approximately (about) 6.38 seconds, and the display device according to Sample #3 exhibited a moment afterimage time of approximately (about) 6.47 seconds.

It can be seen that the moment afterimage time of each of the display devices according to Sample #2 and Sample #3 was decreased by approximately (about) 45% compared to the display device according to Comparative Example 2.

Referring to FIG. 8, the display device according to Comparative Example 2 showed the ISFOM value of approximately (about) −88.7 db. The display device according to Sample #2 showed the ISFOM value of approximately (about) −65.7 db.

It can be seen that the mid to long term afterimage of the display device according to Sample #2 was reduced by approximately (about) 26% compared to the display device according to Comparative Example 2.

Experimental Example 3: Measurement of Transmittance of Display Devices

A camera was placed on the rear surface of the display device according to Sample #2 and the display device according to Comparative Example 2, i.e., under the first base substrate, and the transmittances of light incident on the camera through the display devices were measured.

Figure 9:
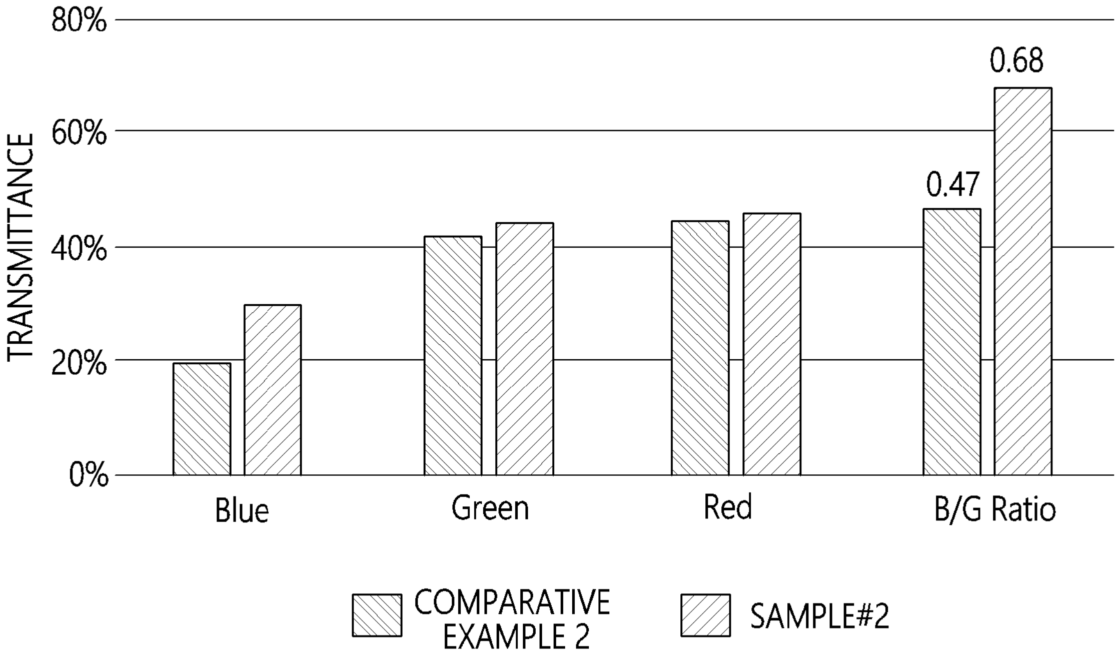
FIG. 9 is a graph of the transmittance of the display devices according to Sample #2 and Comparative Example 2.

FIG. 9 is a graph showing the transmittance values for blue, green, and red light and the B/G ratio of the display devices according to Sample #2 and Comparative Example 2. In FIG. 9, the B/G ratio denotes the ratio of blue light transmittance to green light transmittance.

Referring to FIG. 9, the display device according to Comparative Example 2 exhibited the blue light transmittance of approximately (about) 20%, the green light transmittance of approximately (about) 42%, the red light transmittance of approximately (about) 44%, and the B/G ratio of approximately (about) 0.47. The display device according to Sample #2 exhibited the blue light transmittance of approximately (about) 30%, the green light transmittance of approximately (about) 44%, the red light transmittance of approximately (about) 46%, and the B/G ratio of approximately (about) 0.68.

It can be seen that the B/G ratio, which is a camera characteristic, was significantly improved in the display device according to Sample #2 compared to the display device according to Comparative Example 2.

In concluding the detailed description, those skilled in the art will appreciate that many variations and modifications can be made to the embodiments described herein without substantially departing from the principles of the present disclosure. Therefore, the disclosed preferred embodiments of the present disclosure are utilized in a generic and descriptive sense only and not for purposes of limitation. Instead, one or more suitable changes and modifications can be made by one those skilled in the art within the spirit and scope of the present disclosure as defined by the following claims and equivalents thereof.

What is claimed is:

1. A display device comprising:

a first substrate;

a first barrier layer on the first substrate;

a second substrate on the first barrier layer;

a second barrier layer on the second substrate;

a buffer layer on the second barrier layer;

at least one transistor on the buffer layer; and an organic light-emitting diode on the at least one transistor, wherein the second substrate comprises a polyimide resin, and a dielectric constant of the second substrate is less than a dielectric constant of the first substrate, and wherein the second substrate comprises a polyimide resin and has one or more selected from the group consisting of (i) a glass transition temperature≥350° C.; (ii) a thermal decomposition temperature≥450° C. at 1% weight loss; (iii) a thermal expansion coefficient≤20 ppm/° C.; (iv) a transmittance≥85% at 450 nm; (v) a Young's modulus≥5 GPa; (vi) an elongation≥15%; and (vii) a polyimide resin comprising fluorine atoms, a bent molecular structure, and/or at least one aliphatic ring.

2. The display device of claim 1, wherein the dielectric constant of the second substrate is equal to or less than 3.5.

3. The display device of claim 1, wherein the glass transition temperature of the second substrate is equal to or greater than 350° C.

4. The display device of claim 1, wherein the second substrate has the thermal decomposition temperature of 450° C. or greater when the weight loss rate is 1%.

5. The display device of claim 1, wherein the thermal expansion coefficient of the second substrate is equal to or less than 20 parts per million per (ppm)/° C.

6. The display device of claim 1, wherein the second substrate has the transmittance of 85% or greater for light having the wavelength of 450 nanometer (nm).

7. The display device of claim 1, wherein the Young's modulus of the second substrate is equal to or greater than 5 gigapascal (GPa).

8. The display device of claim 1, wherein an elongation of the second substrate is equal to or greater than 15%.

9. The display device of claim 1, wherein the polyimide resin comprises fluorine atoms.

10. The display device of claim 1, wherein the polyimide resin has the bent molecular structure.

11. The display device of claim 1, wherein the polyimide resin comprises the at least one aliphatic ring.

12. A display device comprising:

a first substrate;

a first barrier layer on the first substrate;

a second substrate on the first barrier layer;

a second barrier layer on the second substrate;

a buffer layer on the second barrier layer;

at least one transistor on the buffer layer; and an organic light-emitting diode on the at least one transistor, wherein at least one of the first substrate or the second substrate comprises a polyimide resin, and has a transmittance of 85% or greater for a light having a wavelength of 450 nm.

13. The display device of claim 12, wherein a dielectric constant of each of the first substrate and the second substrate is equal to or less than 3.5.

14. The display device of claim 12, wherein a glass transition temperature of the second substrate is equal to or greater than 350° C.

15. The display device of claim 12, wherein the second substrate has a thermal decomposition temperature of 450° C. or greater when a weight loss rate is 1%.

16. The display device of claim 12, wherein a thermal expansion coefficient of the second substrate is equal to or less than 20 ppm/° C.

17. The display device of claim 12, wherein the second substrate has a transmittance of 85% or greater for a light having a wavelength of 450 nm.

18. The display device of claim 12, wherein a Young's modulus of the second substrate is equal to or greater than 5 GPa.

19. The display device of claim 12, wherein an elongation of the second substrate is equal to or greater than 15%.

20. The display device of claim 12, wherein the polyimide resin comprises one selected from among

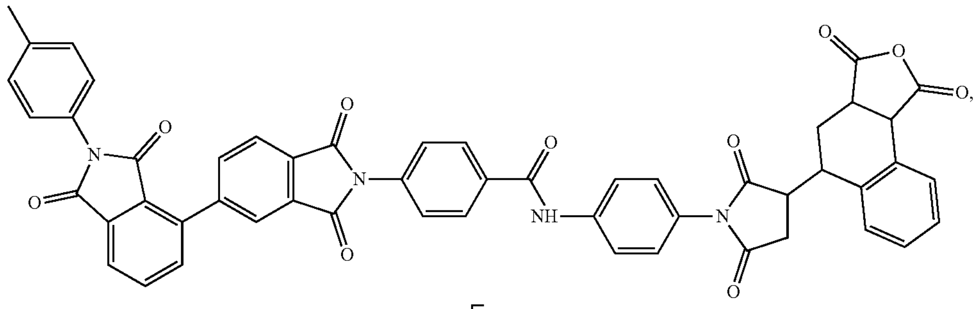

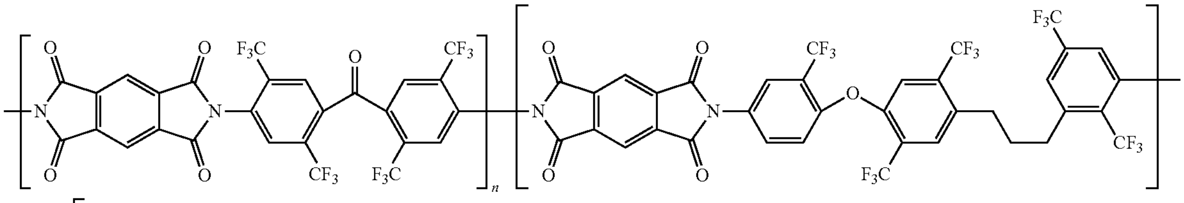
,

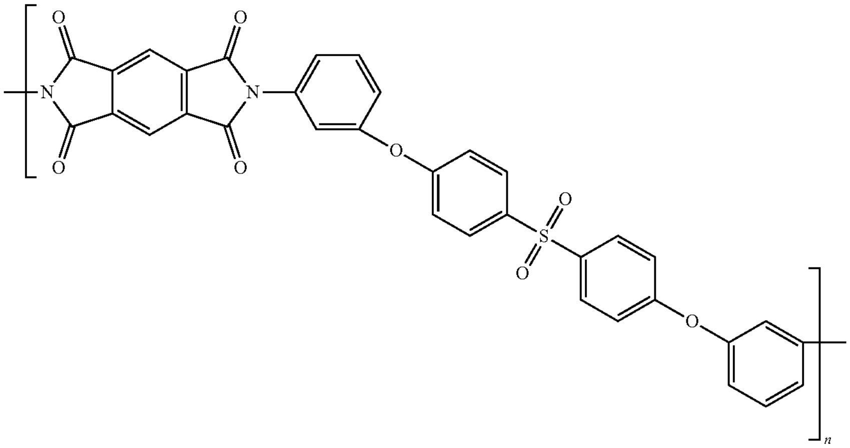
and

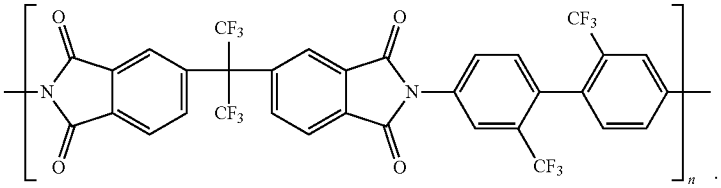
.

21. A display device comprising:

a first substrate;

a first barrier layer on the first substrate;

a second substrate on the first barrier layer;

a first transistor and a second transistor on the second substrate, the first transistor comprising a polysilicon semiconductor layer and the second transistor comprising an oxide semiconductor layer; and an organic light-emitting diode on the first transistor, wherein no conductive member is between the polysilicon semiconductor layer and the second substrate, and wherein the second substrate comprises a polyimide resin and has one or more of selected from the group consisting of: (i) a transmittance of 85% or greater for a light having a wavelength of 450 nm; (ii) the polyimide resin comprising fluorine atoms; (iii) the polyimide resin having a bent molecular structure; and (iv) the polyimide resin comprising at least one aliphatic ring.

22. The display device of claim 21, wherein the second substrate has the transmittance of 85% or greater for light having the wavelength of 450 nm.

23. The display device of claim 21, wherein the second substrate comprises the polyimide resin, and the polyimide resin comprises fluorine atoms.

24. The display device of claim 21, wherein the second substrate comprises the polyimide resin, and the polyimide resin has the bent molecular structure.

25. The display device of claim 21, wherein the second substrate comprises the polyimide resin, and the polyimide resin comprises at least one aliphatic ring.

* * * * *